United States Patent
Yamaji

(10) Patent No.: US 11,562,995 B2
(45) Date of Patent: Jan. 24, 2023

(54) SEMICONDUCTOR INTEGRATED CIRCUIT

(71) Applicant: FUJI ELECTRIC CO., LTD., Kawasaki (JP)

(72) Inventor: Masaharu Yamaji, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 166 days.

(21) Appl. No.: 16/813,104

(22) Filed: Mar. 9, 2020

(65) Prior Publication Data

US 2020/0328203 A1    Oct. 15, 2020

(30) Foreign Application Priority Data

Apr. 11, 2019  (JP) ................................ JP2019-75656
Feb. 13, 2020  (JP) ................................ JP2020-22332

(51) Int. Cl.
*H01L 27/02*    (2006.01)

(52) U.S. Cl.
CPC ................................ *H01L 27/0255* (2013.01)

(58) Field of Classification Search
None
See application file for complete search history.

(56) References Cited

U.S. PATENT DOCUMENTS

| 5,894,156 | A | 4/1999 | Terashima et al. | |
| 9,553,142 | B2 | 1/2017 | Chang et al. | |
| 2007/0085595 | A1 | 4/2007 | Taki et al. | |
| 2009/0050970 | A1* | 2/2009 | Schneider | H01L 29/0684 257/362 |
| 2009/0294865 | A1 | 12/2009 | Tang et al. | |
| 2014/0210002 | A1 | 7/2014 | Sawase et al. | |
| 2015/0236013 | A1 | 1/2015 | Hsu | |
| 2015/0287719 | A1 | 10/2015 | Furuhata | |
| 2016/0300912 | A1* | 10/2016 | Tanaka | H01L 27/0802 |
| 2018/0069076 | A1* | 3/2018 | Tanaka | H01L 27/092 |

FOREIGN PATENT DOCUMENTS

| JP | 9-283716 A | 10/1997 |
| JP | 2005-123512 A | 5/2005 |
| JP | 2014-143363 A | 8/2014 |
| JP | 2015-173255 A | 10/2015 |
| JP | 2015-201500 A | 11/2015 |
| JP | 2017-168478 A | 9/2017 |
| WO | 2017/086069 A1 | 5/2017 |

* cited by examiner

*Primary Examiner* — Steven M Christopher

(57) ABSTRACT

A semiconductor integrated circuit includes a high-potential-side circuit region, a high-voltage junction termination structure surrounding the high-potential-side circuit region, and a low-potential-side circuit region surrounding the high-potential-side circuit region via the high-voltage junction termination structure which are integrated into a single chip, and wherein a first distance between a looped well region and a buried layer in a region in which a first contact region is formed is smaller than a second distance between the looped well region and the buried layer in a region in which a carrier reception region is formed.

20 Claims, 20 Drawing Sheets

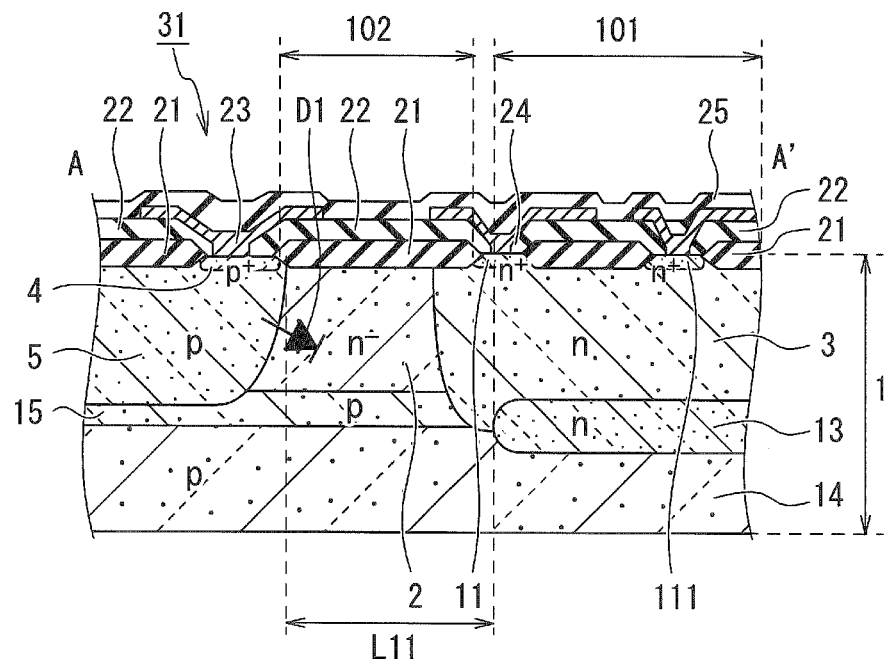
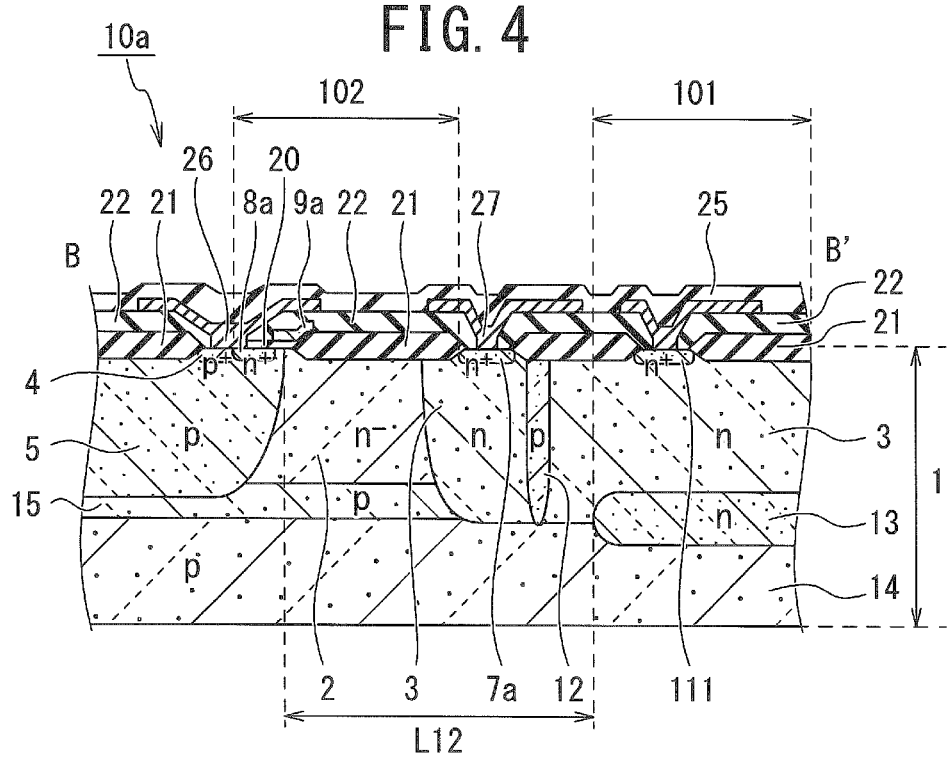

FIG. 5
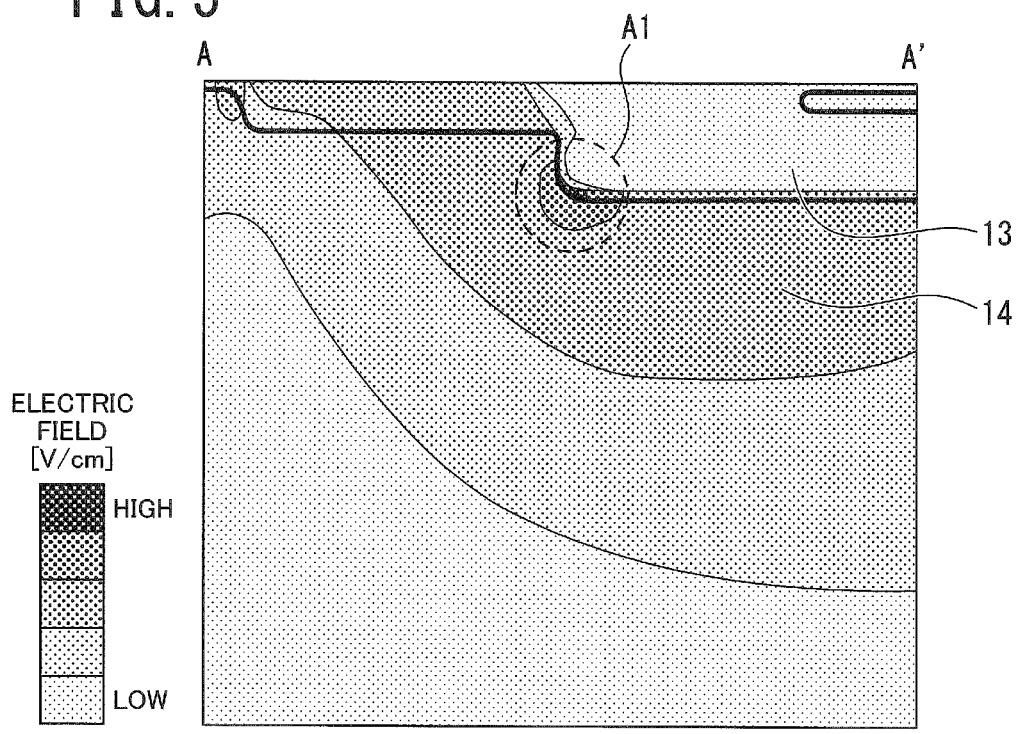
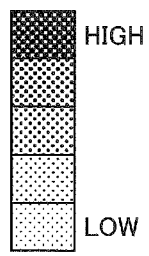
FIG. 6
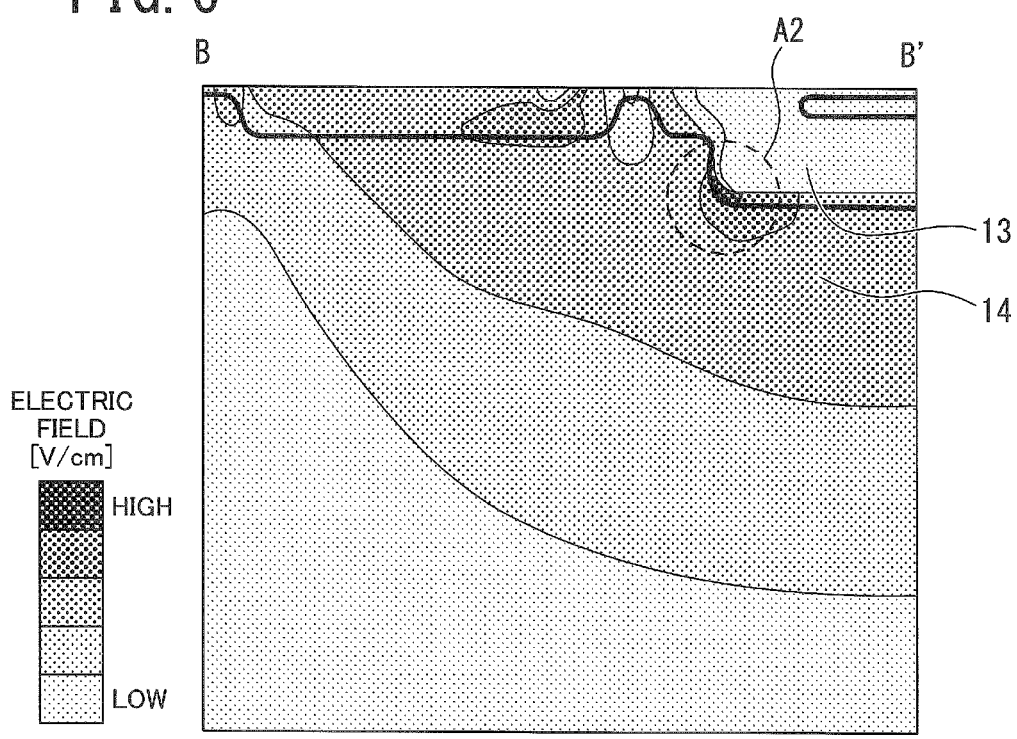
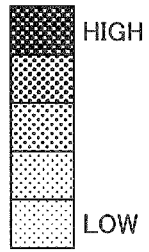

SEMICONDUCTOR INTEGRATED CIRCUIT

CROSS-REFERENCE TO RELATED APPLICATION

This application claims benefit of priority under 35 USC 119 based on Japanese Patent Applications No. 2019-075656 filed on Apr. 11, 2019 and No. 2020-022332 filed on Feb. 13, 2020 the entire contents of which are incorporated by reference herein.

BACKGROUND

1. Field of the Invention

The present invention relates to semiconductor integrated circuits, and more particularly, to a power semiconductor integrated circuit.

2. Description of the Related Art

Low capacity inverters mainly use a high voltage integrated circuit (HVIC) for driving and controlling power switching elements implementing a power conversion bridge circuit, for example. Such a HVIC outputs a drive signal through an output terminal to the respective power switching elements for turning on/off the gates so as to drive the respective power switching elements in accordance with an input signal input through an input terminal. For example, the power conversion bridge circuit executes power conversion when a power switching element on a high potential side and a power switching element on a low potential side each receive the drive signal from the HVIC and start operating.

The HVIC includes a high-potential-side circuit region (a high-side circuit region) and a low-potential-side circuit region (a low-side circuit region) electrically isolated from each other by a high-voltage junction termination structure (HVJT). The HVIC further includes a level shifter for communicating signals between the high-side circuit region and the low-side circuit region.

A structure is known that uses a part of a HVJT as a level shifter. This structure has high reliability since high potential wiring extending over the HVJT is not required. This structure also contributes to a reduction in chip size by an area corresponding to the level shifter, as compared with the case in which the HVJT and the level shifter are separately prepared. To achieve this structure, an internal circuit of the high-side circuit region and the level shifter need to be electrically isolated from each other.

JP H09-283716 discloses a structure, as shown in FIG. 4, in which a level shifter and a high-side circuit region are separated by a p-type slit region so as to electrically isolate an inner circuit of the high-side circuit region from the level shifter. JP H09-283716 also discloses a structure, as shown in FIG. 2, in which the four sides of the high-side circuit region are surrounded by a p-type isolation region so as to electrically isolate the inner circuit of the high-side circuit region from the level shifter.

JP 2015-173255 discloses a structure, as shown in FIG. 3, in which the three sides of a high-side circuit region is surrounded by a p-type slit region so as to electrically isolate an inner circuit of the high-side circuit region from a level shifter. The other one side of the high-side circuit region not provided with the p-type slit region is fixed as the highest potential of the high-side circuit region, and a parasitic resistance between the highest potential and a drain of a high-voltage n-MOSFET serving as a level shifter is used as a level shift resistance.

JP 2005-123512 discloses a structure, as shown in FIG. 4, in which a part of a HVJT is divided by a trench so as to electrically isolate an inner circuit of a high-side circuit region from a level shifter.

JP H09-283176, JP 2015-173255, and JP 2005-123512 each have a configuration in which the HVJT and the level shifter have a uniform length of the drift region (a drift length), and have uniform off-state breakdown voltage. The uniform off-state breakdown voltage allows an avalanche current to flow substantially uniformly through the HVJT and the level shifter because the HVJT and the level shifter are simultaneously led to an avalanche phenomenon when an electrostatic discharge (ESD) surge, for example, is input to the power supply terminal on the high-potential side. This state barely causes local current concentration. The avalanche current, however, causes a parasitic n-p-n bipolar transistor to turn on in the level shifter such as the high-voltage n-type MOSFET to induce a parasitic operation, and thus to be easily damaged as compared with the HVJT which is a p-n junction transistor. While controlling the level shift resistor could regulate the avalanche current flowing through the level shifter so as to eliminate an imbalance in breakdown tolerance, the level shift resistor then needs to be excessively increased in size, leading to the limitation on design.

WO 2017/086069 discloses a structure, as shown in FIG. 6, in which a level shifter has a longer drift length than a HVJT so as to improve ESD breakdown tolerance in the level shifter. This structure decreases an effective area of a high-side circuit to be provided, since a drift region of the level shifter protrudes toward the high-side circuit region. WO 2017/086069 discloses another structure, as shown in FIG. 7, in which the drift region of the level shifter protrudes toward the outer circumferential side of a ground (GND) region, which inevitably leads to an increase in chip area.

SUMMARY

In view of the foregoing problems, the present invention provides a semiconductor integrated circuit as a HVIC using a part of a HVJT as a level shifter so as to have an improved ESD tolerance without an increase in chip area.

An aspect of the present invention inheres in a semiconductor integrated circuit including a high-potential-side circuit region, a high-voltage junction termination structure surrounding the high-potential-side circuit region, and a low-potential-side circuit region surrounding the high-potential-side circuit region via the high-voltage junction termination structure which are integrated into a single chip, the semiconductor integrated circuit including: a middle well region of a first conductivity-type provided in the high-potential-side circuit region; a buried layer of the first conductivity-type buried at a lower portion of the middle well region; a drift region of the first conductivity-type having a looped shape provided in the high-voltage junction termination structure surrounding a circumference of the middle well region; a looped well region of a second conductivity-type surrounding a circumference of the drift region; a carrier supply region of the first conductivity type provided in the looped well region, and included in a level conversion element included in a level shift circuit for communicating signals between the low-potential-side circuit region and the high-potential-side circuit region; a carrier reception region of the first conductivity-type included in the level conversion element, provided in either the drift region or the middle well region, and having a higher impurity concentration than the drift region or the middle well region; and a first contact region of the first conductivity-type provided in either the drift region or the middle well region separately from the carrier reception region, and having a higher impurity concentration than the drift region or the middle well region, wherein a smallest value of a first distance between the looped well region and the buried layer in a region in which the first contact region is formed is smaller than a smallest value of a second distance between the looped well region and the buried layer in a region in which the carrier reception region is formed.

Another aspect of the present invention inheres in a semiconductor integrated circuit including a high-potential-side circuit region, a high-voltage junction termination structure surrounding the high-potential-side circuit region, and a low-potential-side circuit region surrounding the high-potential-side circuit region via the high-voltage junction termination structure which are integrated into a single chip, the semiconductor integrated circuit including: a middle well region of a first conductivity-type provided in the high-potential-side circuit region; a buried layer of the first conductivity-type buried at a lower portion of the middle well region; a drift region of the first conductivity-type having a looped shape provided in the high-voltage junction termination structure surrounding a circumference of the middle well region; a looped well region of a second conductivity-type surrounding a circumference of the drift region; a base region of the first conductivity type provided in the drift region; a carrier supply region of the first conductivity type provided in the base region, and included in a level conversion element included in a level shift circuit for communicating signals between the low-potential-side circuit region and the high-potential-side circuit region; a carrier reception region of the first conductivity-type included in the level conversion element, provided in either the drift region or the middle well region, and having a higher impurity concentration than the drift region or the middle well region; and a first contact region of the first conductivity-type provided in either the drift region or the middle well region separately from the carrier reception region, and having a higher impurity concentration than the drift region or the middle well region, wherein a smallest value of a first distance between the looped well region and the buried layer in a region in which the first contact region is formed is smaller than a smallest value of a second distance between the looped well region and the buried layer in a region in which the carrier reception region is formed.

BRIEF DESCRIPTION OF THE DRAWINGS

FIG. 3 is a cross-sectional view as viewed from direction A-A' in FIG. 2;

FIG. 4 is a cross-sectional view as viewed from direction B-B' in FIG. 2;

FIG. 5 is a view illustrating an electric field intensity simulation result when applying 850 volts in the semiconductor integrated circuit according to the embodiment;

FIG. 6 is a view illustrating an electric field intensity simulation result when applying 1000 volts in the semiconductor integrated circuit according to the embodiment;

DETAILED DESCRIPTION

Figure 1:
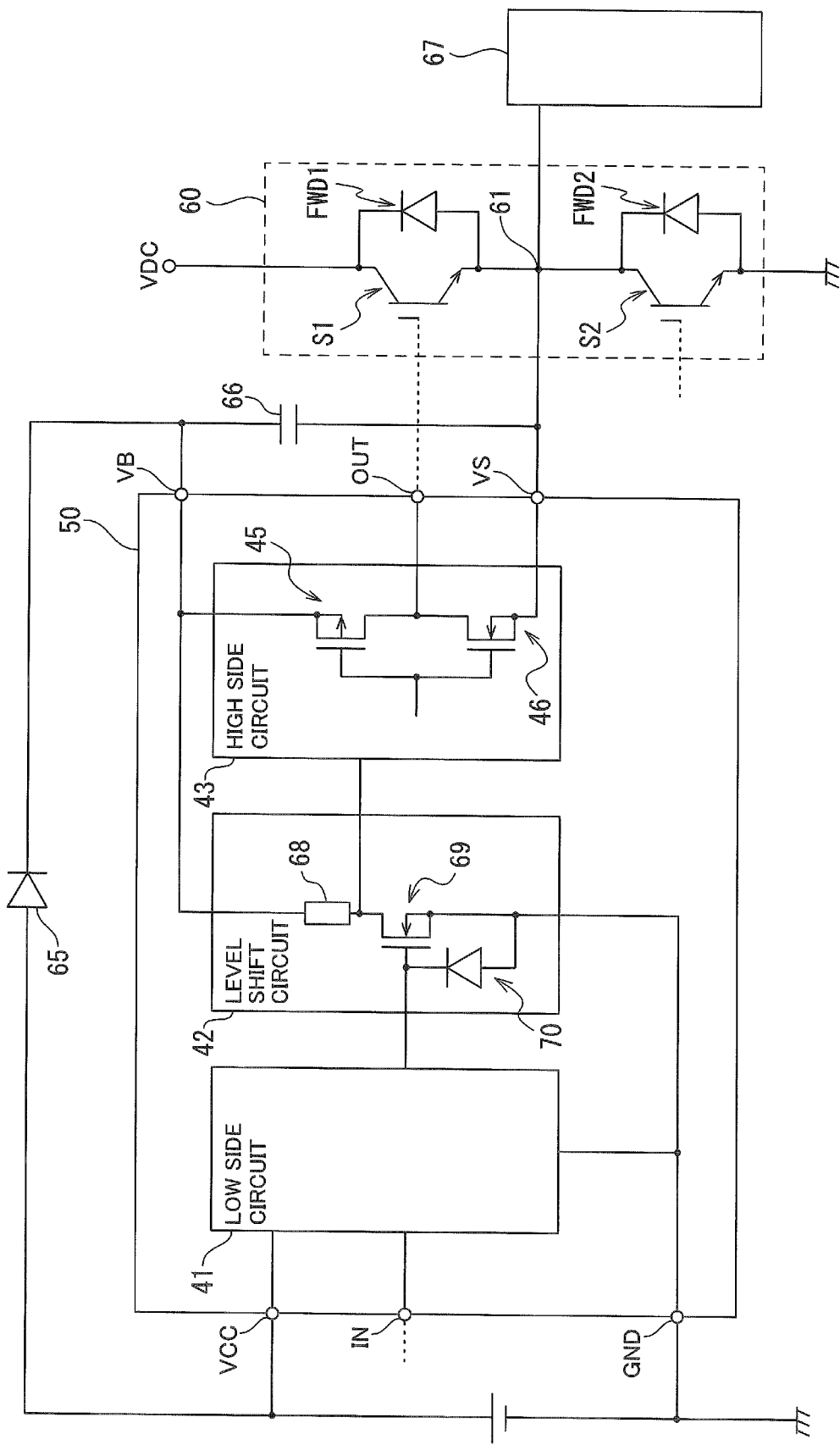
FIG. 1 is a circuit diagram illustrating an example of a semiconductor integrated circuit according to an embodiment.

With reference to the Drawings, embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The embodiments described below merely illustrate schematically devices and methods for specifying and giving shapes to the technical idea of the present invention, and the span of the technical idea is not limited to materials, shapes, structures, and relative positions of elements described herein.

In the Specification, a "carrier supply region" means a semiconductor region which supplies majority carriers as a main current. The carrier supply region is assigned to a semiconductor region which will be a source region in a field-effect transistor (FET) or a static induction transistor (SIT), an emitter region in an insulated-gate bipolar transistor (IGBT), and an anode region in a static induction (SI) thyristor or a gate turn-off (GTO) thyristor. A "carrier reception region" means a semiconductor region which receive majority carriers as a main current. The carrier reception region is assigned to a semiconductor region which will be the drain region in the FET or the SIT, the collector region in the IGBT, and the cathode region in the SI thyristor or GTO thyristor.

A "control electrode" has a function of controlling the main current flowing between the carrier supply region and the carrier reception region. The control electrode is assigned to a gate electrode of the FET, SIT, IGBT, SI thyristor or GTO thyristor.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

Further, in the following description, there is exemplified a case where a first conductivity-type is an n-type and a second conductivity-type is a p-type. However, the relationship of the conductivity-types may be inverted to set the first conductivity-type to the p-type and the second conductivity-type to the n-type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration. Moreover, it is technically and logically obvious that the members and the regions that are limited by adding "first conductivity type" and "second conductivity type" in the following description indicate the members and the regions formed of semiconductor materials without particular obvious limitations.

Embodiment

FIG. 1 illustrates a semiconductor integrated circuit 50 according to the embodiment of the present invention, which is a HVIC that drives a power conversion unit 60 corresponding to one phase of a power conversion bridge circuit, for example. The power conversion unit 60 includes a high-potential-side switching element S1 and a low-potential-side switching element S2 connected in series to implement an output circuit.

While FIG. 1 illustrates the high-potential-side switching element S1 and the low-potential-side switching element S2 each being an IGBT, the high-potential-side switching element S1 and the low-potential-side switching element S2 are not limited to the IGBT, and may be any other power switching element such as a MOSFET. FIG. 1 illustrates an equivalent circuit in which a freewheeling diode FWD1 is connected parallel to the high-potential-side switching element S1 in the reverse direction, and a freewheeling diode FWD2 is connected parallel to the low-potential-side switching element S2 in the reverse direction. For example, the high-potential-side switching element S1 and the freewheeling diode FWD1 may be integrated into a single semiconductor chip (a semiconductor substrate), and the low-potential-side switching element S2 and the freewheeling diode FWD2 may be integrated into another semiconductor chip so as to implement two reverse-conducting IGBTs.

The high-potential-side switching element S1 and the low-potential-side switching element S2 are connected in series between a high-voltage main power supply VDC on the positive electrode side and a ground potential (a GND potential) on the negative electrode side so as to implement a half-bridge circuit. A high-potential-side terminal (a collector terminal) of the high-potential-side switching element S1 is connected to the main power supply VDC, and a low-potential-side terminal (an emitter terminal) of the low-potential-side switching element S2 is connected to the GND potential. A connection point 61 between a low-potential-side terminal (an emitter terminal) of the high-potential-side switching element S1 and a high-potential-side terminal (a collector terminal) of the low-potential-side switching element S2 is an output point of the power conversion unit 60 corresponding to one phase of the power conversion bridge circuit. The connection point 61 is connected with a load 67 such as a motor so as to supply a VS potential in a reference potential terminal VS to the load 67.

The semiconductor integrated circuit 50 according to the embodiment outputs, through an output terminal OUT, a drive signal for turning on/off to drive a gate of the high-potential-side switching element S1 in accordance with an input signal input through an input terminal IN. The semiconductor integrated circuit 50 according to the embodiment includes at least a low-potential-side circuit (a low-side circuit) 41, a level shift circuit 42, and a high-potential-side circuit (a high-side circuit) 43. The low-side circuit 41, the level shift circuit 42, and the high-side circuit 43 may be integrated in a single semiconductor chip in a monolithic manner, for example. Alternatively, elements implementing the low-side circuit 41, the level shift circuit 42, and the high-side circuit 43 may be separately integrated into two or more semiconductor chips in a hybrid manner.

The low-side circuit 41 operates with a GND potential (a first potential) used as a reference potential applied to a ground potential terminal GND and with a VCC potential used as a power supply potential applied to a low-potential-side power supply terminal VCC. The low-side circuit 41 generates an on/off signal at a low-side level in accordance with the input signal input through the input terminal IN, and outputs the on/off signal to the level shift circuit 42. Although not shown, the low-side circuit 41 includes a CMOS circuit including an n-MOS transistor and a p-MOS transistor, for example.

The level shift circuit 42 uses the GND potential (the first potential) used as the reference potential applied to the ground potential terminal GND to convert the on/off signal at the low-side level output from the low-side circuit 41 into an on/off signal at a high-side level to be used in the high-side circuit 43. The level shift circuit 42 includes a level shifter (a level conversion element) 69 which is an n-MOS transistor, for example. A gate terminal of the level shifter 69 is connected to the low-side circuit 41, a source terminal of the level shifter 69 is connected to the ground potential terminal GND, and a drain terminal of the level shifter 69 is connected to an input terminal of the high-side circuit 43. The drain terminal of the level shifter 69 is connected to one terminal of a level shift resistor 68, while the other terminal of the level shift resistor 68 is connected to a high-potential-side power supply terminal VB. A protection diode 70 is connected between the gate and the source of the level shifter 69.

The high-side circuit 43 operates with the VS potential used as a reference potential applied to the reference potential terminal VS and with a VB potential (a second potential) used as a power supply potential applied to the high-potential-side power supply terminal VB. The high-side circuit 43 outputs the drive signal through the output terminal OUT in accordance with the on/off signal from the level shift circuit 42 so as to drive the gate of the high-potential-side switching element S1. The high-side circuit 43 includes a CMOS circuit in the output stage including an n-MOS transistor 46 as a high-potential-side active element and a p-MOS transistor 45 as a reference-potential-side active element, for example. A source terminal of the p-MOS transistor 45 is connected to the high-potential-side power supply terminal VB. A source terminal of the n-MOS transistor 46 is connected to the reference potential terminal VS. The output terminal OUT is connected between a drain terminal of the p-MOS transistor 45 and a drain terminal of the n-MOS transistor 46.

The semiconductor integrated circuit 50 according to the embodiment is herein illustrated with a bootstrap circuit type. FIG. 1 illustrates a bootstrap diode 65 which is an external element connected between the low-potential-side power supply terminal VCC and the high-potential-side power supply terminal VB. A bootstrap capacitor 66 which is an external element is connected between the high-potential-side power supply terminal VB and the reference potential terminal VS. The bootstrap diode 65 and the bootstrap capacitor 66 implement a part of the circuit of the drive power supply of the high-potential-side switching element S1.

The VB potential is the highest potential applied to the semiconductor integrated circuit 50, and is kept at a level higher than the VS potential by about 15 volts due to the bootstrap capacitor 66 in a normal state in which the VB potential is not affected by noise. The VS potential is repeatedly raised and dropped between the high potential (for example, about 400 to 600 volts) and the low potential (the GND potential) of the main power supply VDC by the complementary turn-on and turn-off of the high-potential-side switching element S1 and the low-potential-side switching element S2, and is changed from zero to several hundreds of volts. The VS potential can be a negative potential.

Figure 2:
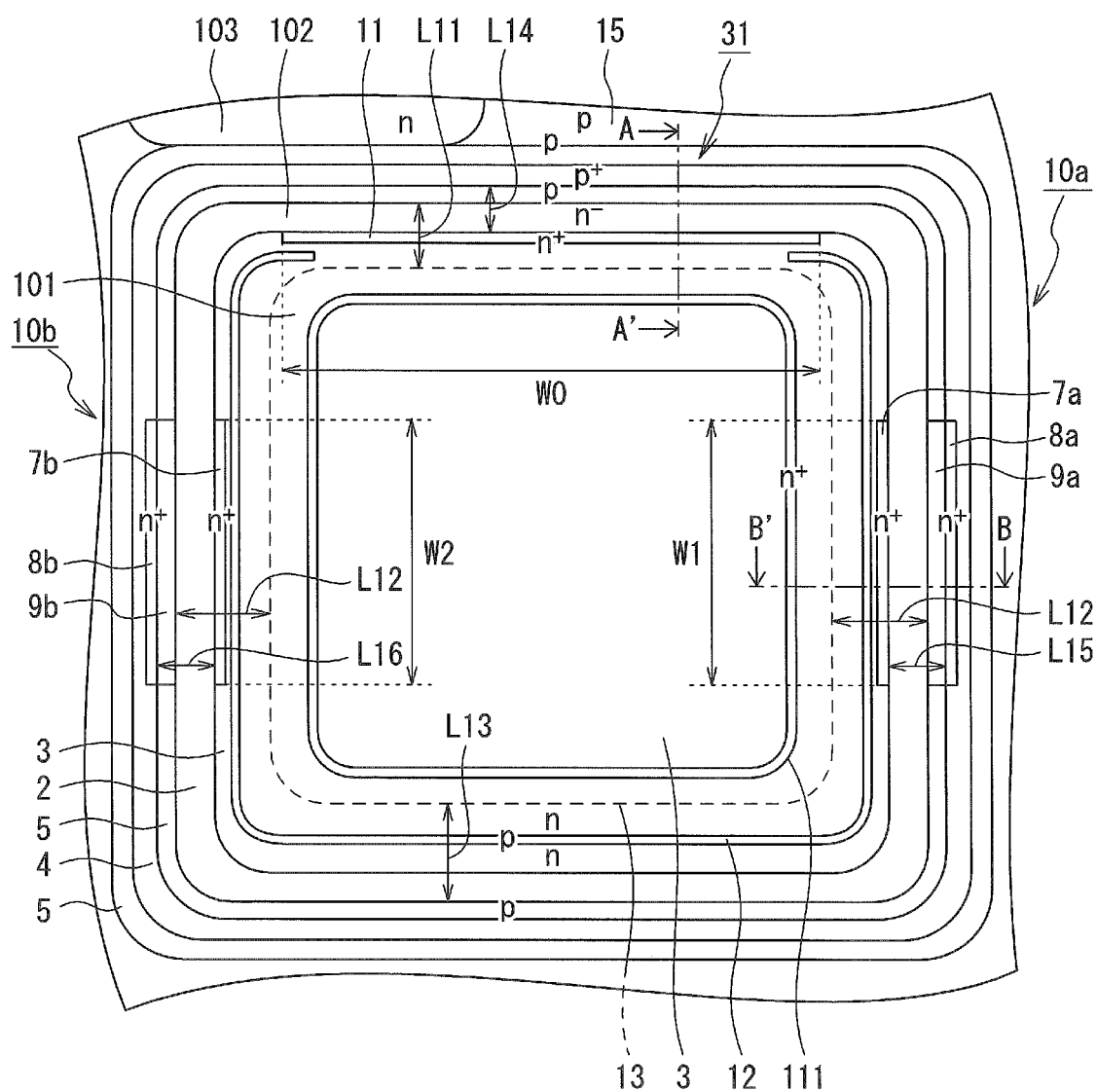
FIG. 2 is a plan view illustrating the example of the semiconductor integrated circuit according to the embodiment.

FIG. 2 is a view illustrating a planar layout of a semiconductor integrated circuit corresponding to the semiconductor integrated circuit 50 according to the embodiment illustrated in FIG. 1. FIG. 2 omits the illustration of some elements such as an interlayer insulating film and electrodes on the upper layer side in the semiconductor integrated circuit according to the embodiment. As illustrated in FIG. 2, the semiconductor integrated circuit according to the embodiment includes a high-potential-side circuit region (a high-side circuit region) 101 and a low-potential-side circuit region (a low-side circuit region) 103 arranged at a circumference of the high-side circuit region 101, which are integrated into a single chip.

The high-side circuit region 101 includes the high-side circuit 43 illustrated in FIG. 1 as an internal circuit, and the low-side circuit region 103 includes the low-side circuit 41 illustrated in FIG. 1 as an internal circuit. FIG. 2 omits the illustration of the respective elements included in the high-side circuit region 101 and the low-side circuit region 103. The semiconductor integrated circuit according to the embodiment further includes a high-voltage junction termination structure (HVJT) 102 arranged into a looped shape around the high-side circuit region 101. The HVJT 102 electrically isolates the high-side circuit region 101 from the low-side circuit region 103.

The high-side circuit region 101 is located in a middle well region 3 of a first conductivity-type (n-type). As illustrated in FIG. 2, the middle well region 3 has a rectangular shape in a planar pattern. A first contact region (a first diode terminal contact region) 11 of $n^+$-type is provided at a part of the circumference of the middle well region 3. The first contact region 11 extends straight along one side of the middle well region 3. The first contact region 11 is electrically connected to the high-potential-side power supply terminal VB illustrated in FIG. 1 to which the VB potential is applied.

A slit region 12 of p-type is provided at the other part of the circumference of the middle well region 3. The slit region 12 is delineated into a C-shape with the upper side open along the three sides of the middle well region 3 excluding the one side provided with the first contact region 11. Both ends of the slit region 12 slightly extends toward the middle (the inner side) of one side of the middle well region 3 to overlap in parallel with both ends of the first contact region 11. A contact region 111 of $n^+$-type is delineated into a looped shape (a frame-like shape) inside the slit region 12. The contact region 111 is electrically connected to the high-potential-side power supply terminal VB.

The HVJT 102 is provided with a drift region (a voltage blocking region) 2 of $n^-$-type having a looped shape (a frame-like shape) to surround the circumference of the middle well region 3. The drift region 2 has a lower impurity concentration than the middle well region 3. While FIG. 2 illustrates the case in which the first contact region 11 is provided at the upper portion of the middle well region 3, the first contact region 11 may be provided at the upper portion of the drift region 2.

A looped well region (an isolation region) 5 of a second conductivity-type (p-type) is provided into a looped shape (a frame-like shape) around the circumference of the drift region 2. A second contact region (a second diode terminal contact region) 4 of $p^+$-type is provided into a looped shape at the upper portion of the looped well region 5. The second contact region 4 has a higher impurity concentration than the looped well region 5. The second contact region 4 is electrically connected to the ground potential terminal GND illustrated in FIG. 1 to which the GND potential is applied.

The low-side circuit region 103 is a well region of n-type provided adjacent to the circumference of the looped well region 5. The n-type well region implementing the low-side circuit region 103 is provided at the same depth as the middle well region 3.

A first level conversion element 10a and a second level conversion element 10b are each provided in a part of the HVJT 102. The first level conversion element 10a and the second level conversion element 10b correspond to the level shifter 69 illustrated in FIG. 1. The first level conversion element 10a and the second level conversion element 10b may independently implement the n-MOS transistor which turns on when the input signal is an on-state signal and an n-MOS transistor which turns on when the input signal is an off-state signal. As illustrated in FIG. 2, the first level conversion element 10a and the second level conversion element 10b are opposed to each other at symmetrical positions. The arrangement positions of the first level conversion element 10a and the second level conversion element 10b are not limited to the symmetrical positions, and the first level conversion element 10a and the second level conversion element 10b are each only required to be arranged in a part of the HVJT 102.

The semiconductor integrated circuit according to the embodiment includes the slit region 12 surrounding the high-side circuit region 101 so as to increase a parasitic resistance value between the first contact region 11 of the high-side circuit region 101 and each of a first carrier reception region 7a of the first level conversion element 10a and a second carrier reception region 7b of the second level conversion element 10b described below. This is a method of regulating resistance values between the first contact region 11 and each of the first carrier reception region 7a and the second carrier reception region 7b in accordance with the length of the slit region 12 in a planar pattern (a parasitic resistance value regulation method). This parasitic resistance can be used as the level shift resistor 68. Alternatively, a resistor element having a smaller resistance value than the parasitic resistance preliminarily set to have a sufficiently large resistance value, may be provided parallel to the parasitic resistance so as to serve as the level shift resistor 68. The resistor element may be made of polycrystalline silicon, and may be arranged in the high-side circuit region 101.

The first level conversion element 10a illustrated on the right side of FIG. 2 includes the drift region 2 having a looped shape, and a common base region implemented by a part of the p-type looped well region 5. The first level conversion element 10a further includes a first source region (a first carrier supply region) 8a of $n^+$-type, and the first drain region (the first carrier reception region) 7a of $n^+$-type provided to be opposed to the first carrier supply region 8a. The first carrier supply region 8a and the first carrier reception region 7a each have a higher impurity concentration than the drift region 2 and the middle well region 3. The looped well region 5 may be provided on the inner side with a shallow region formed into a looped shape at the upper portion of the drift region 2. The shallow region may serve as the common base region in which the first carrier supply region 8a may be provided.

The first carrier supply region 8a is electrically connected to the ground potential terminal GND illustrated in FIG. 1 to which the GND potential is applied. The first carrier reception region 7a is electrically connected via the level shift resistor 68 to the high-potential-side power supply terminal VB illustrated in FIG. 1 to which the VB potential is applied.

The first level conversion element 10a further includes a first gate electrode (a control electrode) 9a provided, via a gate insulating film (not illustrated), on the common base region interposed between the first carrier supply region 8a and the drift region 2. The gate insulating film may be a silicon oxide ($SiO_2$) film or any other insulating films, such as a silicon nitride ($Si_3N_4$) film, or may be made of a stacked film of insulating films including a $SiO_2$ film and a $Si_3N_4$ film. The first gate electrode 9a controls a potential of the common base region implemented by a part of the looped well region 5. The first gate electrode 9a is made of a polycrystalline silicon (doped polysilicon) film to which impurity ions are doped, refractory metal, or refractory metal silicide, for example.

The second level conversion element 10b illustrated on the left side of FIG. 2 has a mirror-image relationship to the first level conversion element 10a so as to have a configuration equivalent to the first level conversion element 10a. The second level conversion element 10b includes the drift region 2 having a looped shape, and the common base region common to the first level conversion element 10a and implemented by a part of the p-type looped well region 5. The second level conversion element 10b further includes a second source region (a second carrier supply region) 8b of $n^+$-type, and a second drain region (a second carrier reception region) 7b of $n^+$-type provided to be opposed to the second carrier supply region 8b. The second level conversion element 10b further includes a second gate electrode (a control electrode) 9b provided, via a gate insulating film (not illustrated), on the common base region interposed between the second carrier supply region 8b and the drift region 2.

FIG. 3 is a cross-sectional view as viewed from direction A-A' on the upper side in FIG. 2, including a region (a diode-forming region) 31 in which the second contact region 4 and the first contact region 11 face each other. As illustrated in FIG. 3, the semiconductor integrated circuit according to the embodiment is provided in a base body 1. The base body 1 has a stacked structure including a semiconductor substrate 14 of p-type made of silicon (S1), and an epitaxially-grown layer 15 of p-type made of S1 deposited on the semiconductor substrate 14. The semiconductor substrate 14, when the semiconductor integrated circuit 50 according to the embodiment is in operation, is fixed to the GND potential, for example. The slit region 12 is not provided between the second contact region 4 and the first contact region 11 in the diode-forming region 31.

As illustrated in FIG. 2 and FIG. 3, the n-type middle well region 3 is selectively provided in the epitaxially-grown layer 15. A buried layer 13 of n-type is uniformly buried at the lower portion of the middle well region 3, namely, between the semiconductor substrate 14 and the middle well region 3. The buried layer 13 is a diffusion layer doped with n-type impurity ions such as antimony (Sb), phosphorus (P), or arsenic (As). The buried layer 13 has a higher impurity concentration than the middle well region 3. FIG. 2 schematically indicates the position of the n-type buried layer 13 in the planar pattern under the middle well region 3 by the broken line. The buried layer 13 has a substantially rectangular shape in the planar pattern. The internal circuit of the high-side circuit region 101 is provided inside the buried layer 13 in the planar pattern. While the drawings illustrate the contact region 111 arranged inside the buried layer 13, the contact region 111 may be arranged on the outside of the buried layer 13.

The buried layer 13 illustrated in FIG. 2 and FIG. 3 has a function of suppressing an operation of a parasitic p-n-p bipolar transistor in the depth direction formed in the internal circuit of the high-side circuit region 101. When the HVIC is in normal operation, the parasitic p-n-p bipolar transistor in the depth direction formed in the internal circuit of the high-side circuit region 101 does not activate since the VB potential is higher than the VS potential. However, the parasitic p-n-p bipolar transistor turns on when the VB potential is led to a negative voltage lower than the VS potential (a voltage of a minus potential) because of noise such as a lightning surge if the buried layer 13 is not provided, causing a large current to flow toward the semiconductor substrate 14. The provision of the buried layer 13 thus can avoid the operation of the parasitic p-n-p bipolar transistor, so as to prevent damage to the HVIC accordingly.

The $n^+$-type first contact region (the first diode terminal contact region) 11 is selectively provided at the upper portion of the middle well region 3. The first contact region 11 is in ohmic contact with a cathode electrode (a first diode electrode) 24 via a contact hole of a field insulating film 21 made by local oxidation of silicon (LOCOS), for example, and the interlayer insulating film 22 on the field insulating film 21. The cathode electrode 24 is covered with a passivation film 25. The $n^+$-type contact region 111 is selectively provided inside the first contact region 11 in the upper portion of the middle well region 3. The contact region 111 is in ohmic contact with an electrode 28 corresponding to the high-potential-side power supply terminal VB.

The $n^-$-type drift region 2 is provided on the epitaxially-grown layer 15 to surround the circumference of the middle well region 3. The drift region 2 may penetrate the epitaxially-grown layer 15 in the depth direction so as to be in contact with the semiconductor substrate 14. The p-type looped well region 5 is selectively provided at the upper portion of the epitaxially-grown layer 15 so as to surround the circumference of the drift region 2. The looped well region 5 may penetrate the epitaxially-grown layer 15 in the depth direction so as to be in contact with the semiconductor substrate 14. The $p^+$-type second contact region (the second diode terminal contact region) 4 is selectively provided at the upper portion of the looped well region 5. The second contact region 4 is in ohmic contact with an anode electrode (a second diode electrode) 23 via the contact hole of the field insulating film 21 and the interlayer insulating film 22. The anode electrode 23 is covered with the passivation film 25.

As schematically illustrated in FIG. 3, a parasitic diode D1 is formed by the p-n junction between the $n^-$-type drift region 2 and the p-type looped well region 5 to implement the HVJT 102. The looped well region 5 serves as an anode region of the parasitic diode D1, and the second contact region 4 serves as an anode contact region of the parasitic diode D1. The drift region 2 and the middle well region 3 in the first level conversion element 10a and the second level conversion element 10b serve as a cathode region of the parasitic diode D1, and the first contact region 11 serves as a cathode contact region of the parasitic diode D1.

FIG. 4 is a cross-sectional view as viewed from direction B-B' in FIG. 2 including the first level conversion element 10a. As illustrated in FIG. 2 and FIG. 4, the n-type middle well region 3 is selectively provided in the p-type epitaxially-grown layer 15 provided on the p-type semiconductor substrate 14. The n-type buried layer 13 is buried between the semiconductor substrate 14 and the middle well region 3. The p-type slit region 12 is selectively provided so as to penetrate the middle well region 3 in the depth direction. The bottom portion of the slit region 12 is in contact with the semiconductor substrate 14. The slit region 12 may be implemented by the epitaxially-grown layer 15 such that a part of the middle well region 3 is missed.

The $n^+$-type first carrier reception region 7a is selectively provided at the upper portion of the middle well region 3. The first carrier reception region 7a is connected to a carrier reception electrode (a drain electrode) 27 via the contact hole of the field insulating film 21 and the interlayer insulating film 22. The carrier reception electrode 27 is covered with the passivation film 25.

The $n^-$-type drift region 2 is provided at the upper portion of the epitaxially-grown layer 15 to surround the circumference of the middle well region 3. The p-type looped well region 5 serving as the commons base region is selectively provided at the upper portion of the epitaxially-grown layer 15 so as to surround the circumference of the drift region 2. The $n^+$-type first carrier supply region 8a is selectively provided at the upper portion of the looped well region 5.

The $p^+$-type second contact region 4 is selectively provided at the upper portion of the looped well region 5. The second contact region 4 is in contact with the first carrier supply region 8a to serve as a back gate region. The first carrier supply region 8a and the second contact region 4 are connected to a carrier supply electrode (a source electrode) 26 via the field insulating film 21 and the contact hole of the interlayer insulating film 22. The carrier supply electrode 26 is covered with the passivation film 25. The carrier supply electrode 26 is an electrode common to the anode electrode (the second diode electrode) 23, and is electrically connected to the ground potential terminal GND. The first gate electrode (the control electrode) 9a is provided via the gate insulating film 20 on the looped well region 5 between the first carrier supply region 8a and the drift region 2.

The semiconductor integrated circuit according to the embodiment has a configuration in which the buried layer 13 is separated from the looped well region 5 with a greater gap in the respective portions in which the first level conversion element 10a and the second level conversion element 10b are formed, than in the diode-forming region 31 in which the second contact region 4 and the first contact region 11 face each other, as illustrated on the upper side in FIG. 2. In particular, a distance (a first distance) L11 between the buried layer 13 and the looped well region 5 serving as the anode region of the p-n junction diode D1 in the diode-forming region 31 illustrated in FIG. 2 and FIG. 3, is shorter than a distance (a second distance) L12 between the buried layer 13 and the looped well region 5 serving as the common base region common to the first level conversion element 10a and the second level conversion element 10b illustrated in FIG. 2 and FIG. 4. For example, the first distance L11 is set in a range of about 90 nanometers to 100 nanometers, and the second distance L12 is set in a range of about 100 nanometers to 110 nanometers.

The first distance L11 is not necessarily constant in the entire diode-forming region 31, and may be partly equal to the second distance L12 in the diode-forming region 31. The distance L12 is not necessarily constant in the respective portions in which the first level conversion element 10a and the second level conversion element 10b are formed. The smallest value of the first distance L11, however, should be smaller than the smallest value of the second distance L12. Namely, the smallest value of the first distance L11 between the looped well region 5 and the buried layer 13 in the diode-forming region 31 in which the first contact region 11 is provided, is smaller than the smallest value of the second distance L12 between the looped well region 5 and the buried layer 13 in the respective portions in which the first level conversion element 10a and the second level conversion element 10b are formed.

A length of the first contact region 11 (a width of the diode-forming region 31) W0 in which the first distance L11 is shorter than the second distance L12 is determined as appropriate depending on which level the ESD tolerance needs to be increased to. The width W0 of the diode-forming region 31 in which the first distance L11 is shorter than the second distance L12 is preferably greater than or equal to the sum of a channel width W1 of the first level conversion element 10a and a channel width W2 of the second level conversion element 10b. The width W0 is more preferably greater than or equal to twice the sum of the channel width W1 and the channel width W2.

While FIG. 2 illustrates the case in which the first distance L11 is shorter than the second distance L12 only in the diode-forming region 31 located on one side of the middle well region 3 with rectangular shape in the planar pattern, the distance between the looped well region 5 and the buried layer 13 may be set to the first distance L11 on the two, three, or four sides of the middle well region 3 excluding the portions in which the first level conversion element 10a and the second level conversion element 10b are formed. For example, a distance L13 between the looped well region 5 and the buried layer 13 on one side of the middle well region 3 indicated on the lower side in FIG. 2 is equivalent to the second distance L12, but may be set to the first distance L11.

As illustrated in FIG. 2, a drift length L14 of the diode-forming region 31 and a drift length L15 of the first level conversion element 10a and a drift length L16 of the second level conversion element 10b may be either substantially the same or different from each other. The drift length L14 of the diode-forming region 31 may be shorter than the drift length L15 of the first level conversion element 10a and the drift length L16 of the second level conversion element 10b. For example, the drift length L14 of the diode-forming region 31 is defined as a distance between the first contact region 11 and the second contact region 4. The drift length L15 of the first level conversion element 10a is defined as a distance between the first carrier supply region 8a and the first carrier reception region 7a in the first level conversion element 10a. The drift length L16 of the second level conversion element 10b is defined as a distance between the second carrier supply region 8b and the second carrier reception region 7b in the second level conversion element 10b.

According to the semiconductor integrated circuit of the embodiment, the first distance L11 between the looped well region 5 and the buried layer 13 in the diode-forming region 31 is set to be shorter than the second distance L12 between the looped well region 5 and the buried layer 13 in the respective portions in which the first level conversion element 10a and the second level conversion element 10b are formed, so as to relax an electric field in the respective portions in which the first level conversion element 10a and the second level conversion element 10b are formed, and lead the off-state breakdown voltage in the respective portions in which the first level conversion element 10a and the second level conversion element 10b are formed to be greater than the off-state breakdown voltage in the diode-forming region 31. An avalanche current thus mainly flows through the parasitic diode D1 not having a parasitic structure if an ESD surge is input to lead to an avalanche phenomenon. This prevents the avalanche current in the parasitic diode D1 causing the parasitic operation from flowing into the first level conversion element 10a and the second level conversion element 10b, so as to improve the ESD tolerance in the entire semiconductor integrated circuit.

<Simulation Results>

FIG. 5 and FIG. 6 are views showing electric field intensity simulation results in the cross section of the diode-forming region 31 corresponding to FIG. 3 as viewed from direction A-A' in FIG. 2 and in the cross section of the portion in which the first level conversion element 10a is formed corresponding to FIG. 4 as viewed from direction B-B' in FIG. 2. The region A1 surrounded by the circle in FIG. 5 indicates an electric field concentration point in the diode-forming region 31 during the application of 850 volts. The region A2 surrounded by the circle in FIG. 6 indicates an electric field concentration point in the portion in which the first level conversion element 10a is formed during the application of 1000 volts. As shown in both FIG. 5 and FIG. 6, the electric field concentrates at the edge of the buried layer 13.

Figure 7:
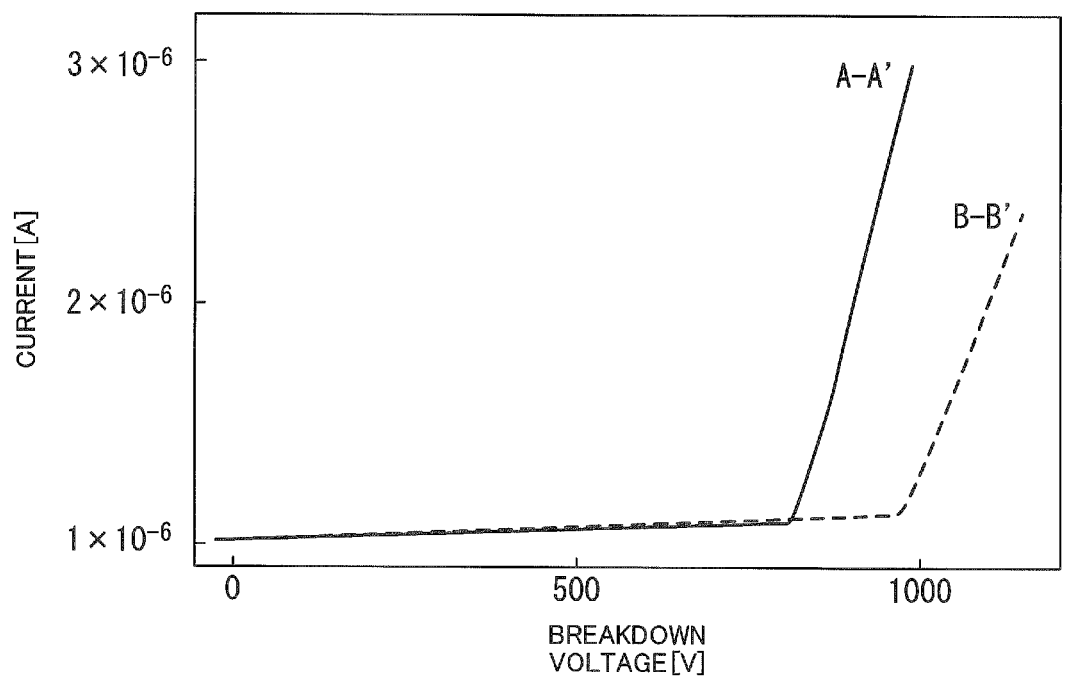
FIG. 7 is a graph illustrating a breakdown voltage simulation result in the semiconductor integrated circuit according to the embodiment.

FIG. 7 is a view showing a breakdown voltage simulation result in the semiconductor integrated circuit according to the embodiment. The profile "A-A'" in FIG. 7 indicates a breakdown voltage in the diode-forming region 31, and the profile "B-B'" in FIG. 7 indicates a breakdown voltage in the portion in which the first level conversion element 10a is formed. As shown in FIG. 7, the breakdown voltage is higher in the portion in which the first level conversion element 10a is formed than in the diode-forming region 31.

Comparative Examples

Figure 8:
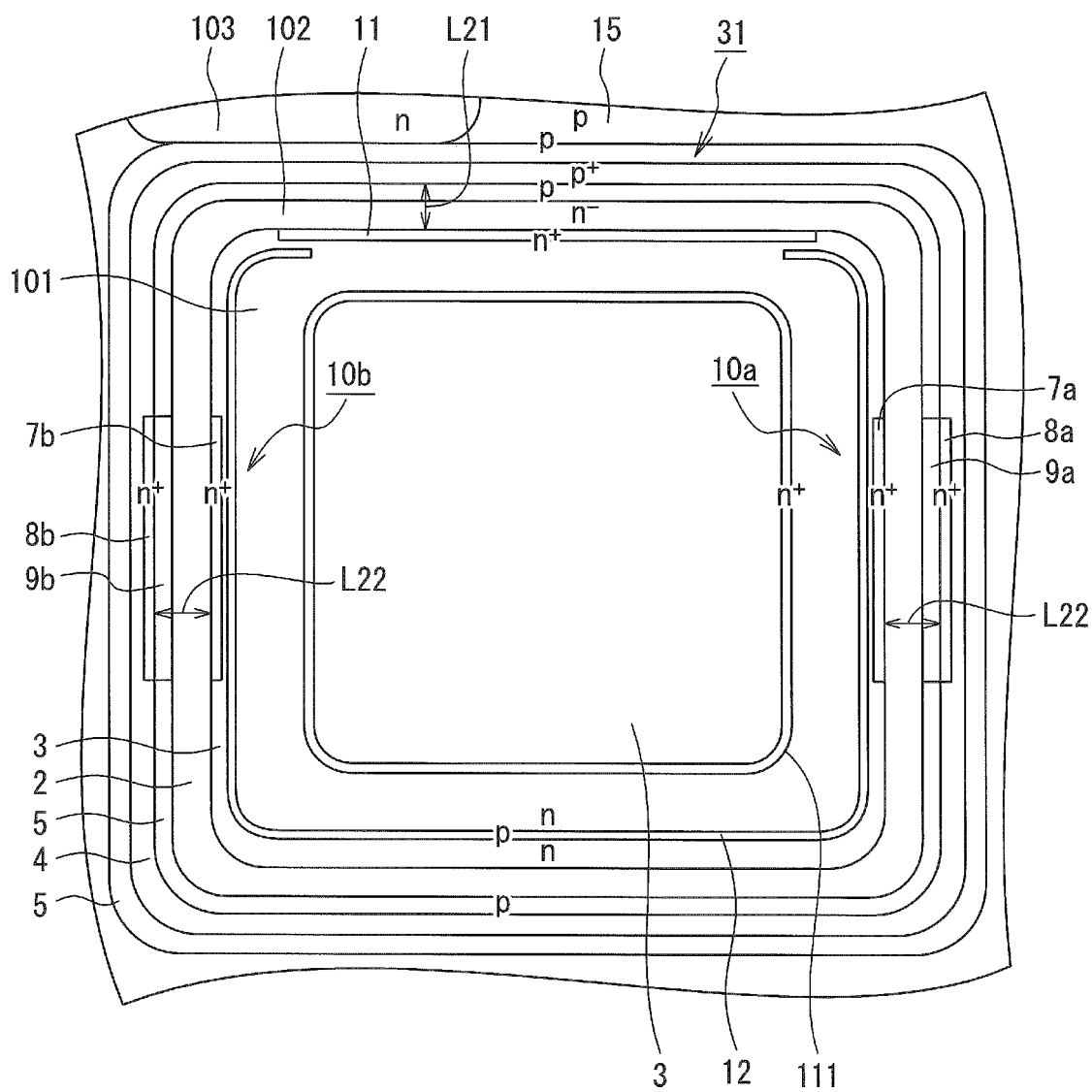
FIG. 8 is a plan view illustrating a semiconductor integrated circuit of a first comparative example.

Semiconductor integrated circuits of first to third comparative examples are described below with reference to FIG. 8 to FIG. 10. The semiconductor integrated circuit of the first comparative example illustrated in FIG. 8 differs from the semiconductor integrated circuit according to the embodiment in lacking the buried layer 13 buried under the middle well region 3 illustrated in FIG. 3. The semiconductor integrated circuit of the first comparative example lacking the buried layer 13 buried under the middle well region 3 tends to cause a parasitic element to operate in the internal circuit of the high-side circuit region 101. In contrast, the semiconductor integrated circuit according to the embodiment including the buried layer 13 buried under the middle well region 3, as illustrated in FIG. 3, can avoid the operation of the parasitic element in the internal circuit of the high-side circuit region 101.

In the semiconductor integrated circuit of the first comparative example, the drift length L21 of the diode-forming region 31 and the drift length L22 of the first level conversion element 10a and the second level conversion element 10b conform to each other. The diode-forming region 31 and the first level conversion element 10a and the second level conversion element 10b also have a uniform off-state breakdown voltage. The uniform off-state breakdown voltage leads the diode-forming region 31, the first level conversion element 10a and the second level conversion element 10b simultaneously to the avalanche phenomenon when the ESD surge is input, for example, and the avalanche current thus flows substantially uniformly through the diode-forming region 31, the first level conversion element 10a and the second level conversion element 10b. This state barely causes local current concentration. The avalanche current, however, causes the parasitic n-p-n bipolar transistor to turn on in the first level conversion element 10a and the second level conversion element 10b such as the high-voltage n-type MOSFET to induce a parasitic operation, and thus to be easily damaged as compared with the p-n junction diode D1. While controlling the level shift resistor could regulate the avalanche current flowing through the first level conversion element 10a and the second level conversion element 10b so as to eliminate an imbalance in breakdown tolerance, the level shift resistor then needs to be excessively increased in size, leading to the limitation on design.

In contrast, in the semiconductor integrated circuit according to the embodiment, as illustrated in FIG. 2 to FIG. 4, the first distance L11 between the looped well region 5 and the buried layer 13 in the diode-forming region 31 is set to be shorter than the second distance L12 between the looped well region 5 and the buried layer 13 in the respective portions in which the first level conversion element 10a and the second level conversion element 10b are formed, so as to relax the electric field in the first level conversion element 10a and the second level conversion element 10b to improve the ESD tolerance in the entire semiconductor integrated circuit. This structure can expand the possibility of design, as compared with the case of regulating the avalanche current only by the level shift resistor. Further, the balance of the breakdown voltage between the diode-forming region 31 and each of the first level conversion element 10a and the second level conversion element 10b can be changed due to the arrangement of the buried layer 13, so as to eliminate the necessity of expanding the width (the drift length) of the drift region (the voltage blocking region) 2 implementing the HVJT 102, preventing an increase in chip area accordingly.

Figure 9:
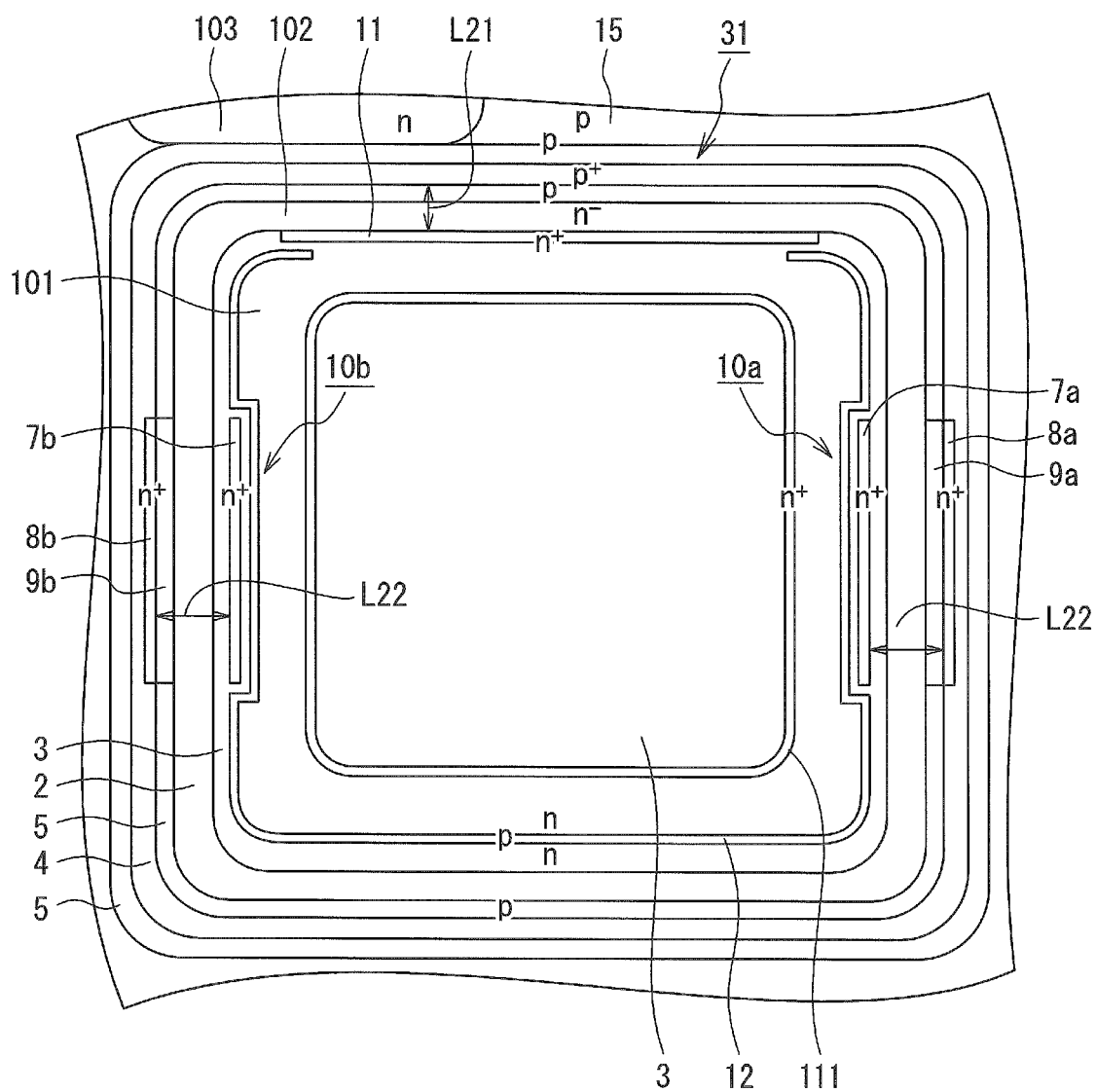
FIG. 9 is a plan view illustrating a semiconductor integrated circuit of a second comparative example.

The semiconductor integrated circuit of the second comparative example illustrated in FIG. 9 differs from the semiconductor integrated circuit according to the embodiment in that the inner circumferential surface of the drift region (the voltage blocking region) implementing the HVJT 102 partly protrudes inward so as to increase the drift length L22 of each of the first level conversion element 10a and the second level conversion element 10b. The semiconductor integrated circuit of the second comparative example inevitably decreases the effective area of the internal circuit of the high-side circuit region 101 because of the inward projection of the first level conversion element 10a and the second level conversion element 10b. The semiconductor integrated circuit according to the embodiment can improve the ESD tolerance in the entire semiconductor integrated circuit without decreasing the effective area of the internal circuit of the high-side circuit region 101.

Figure 10:
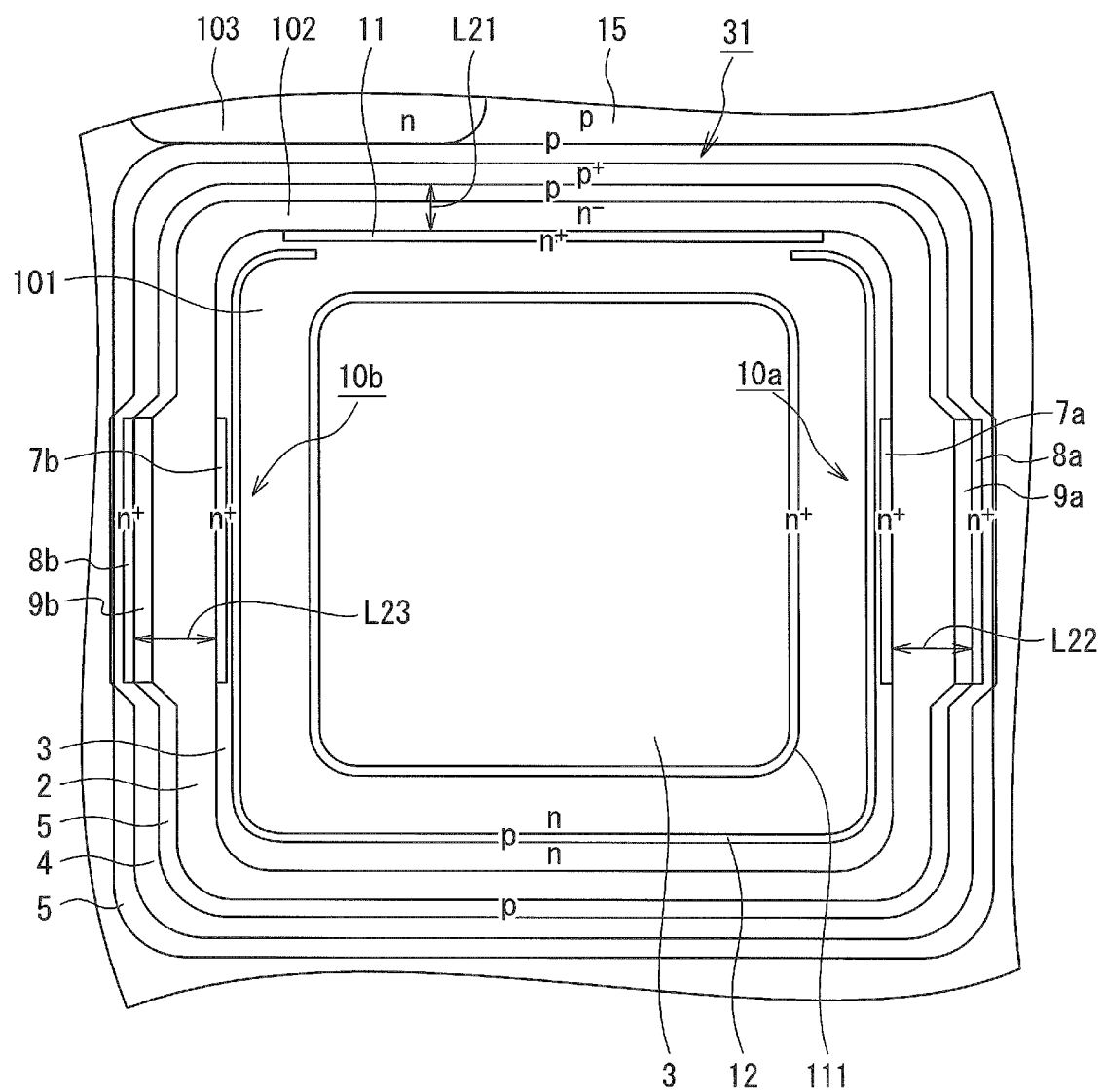
FIG. 10 is a plan view illustrating a semiconductor integrated circuit of a third comparative example.

The semiconductor integrated circuit of the third comparative example illustrated in FIG. 10 differs from the semiconductor integrated circuit according to the embodiment in that the outer circumferential surface of the drift region 2 partly protrudes outward so as to increase the drift length L22 of each of the first level conversion element 10a and the second level conversion element 10b. The semiconductor integrated circuit of the third comparative example inevitably leads to the increase in chip area because of the outward projection of the first level conversion element 10a and the second level conversion element 10b. The semiconductor integrated circuit according to the embodiment can improve the ESD tolerance in the entire semiconductor integrated circuit while minimizing the increase in chip area.

First Modified Example

Figure 11:
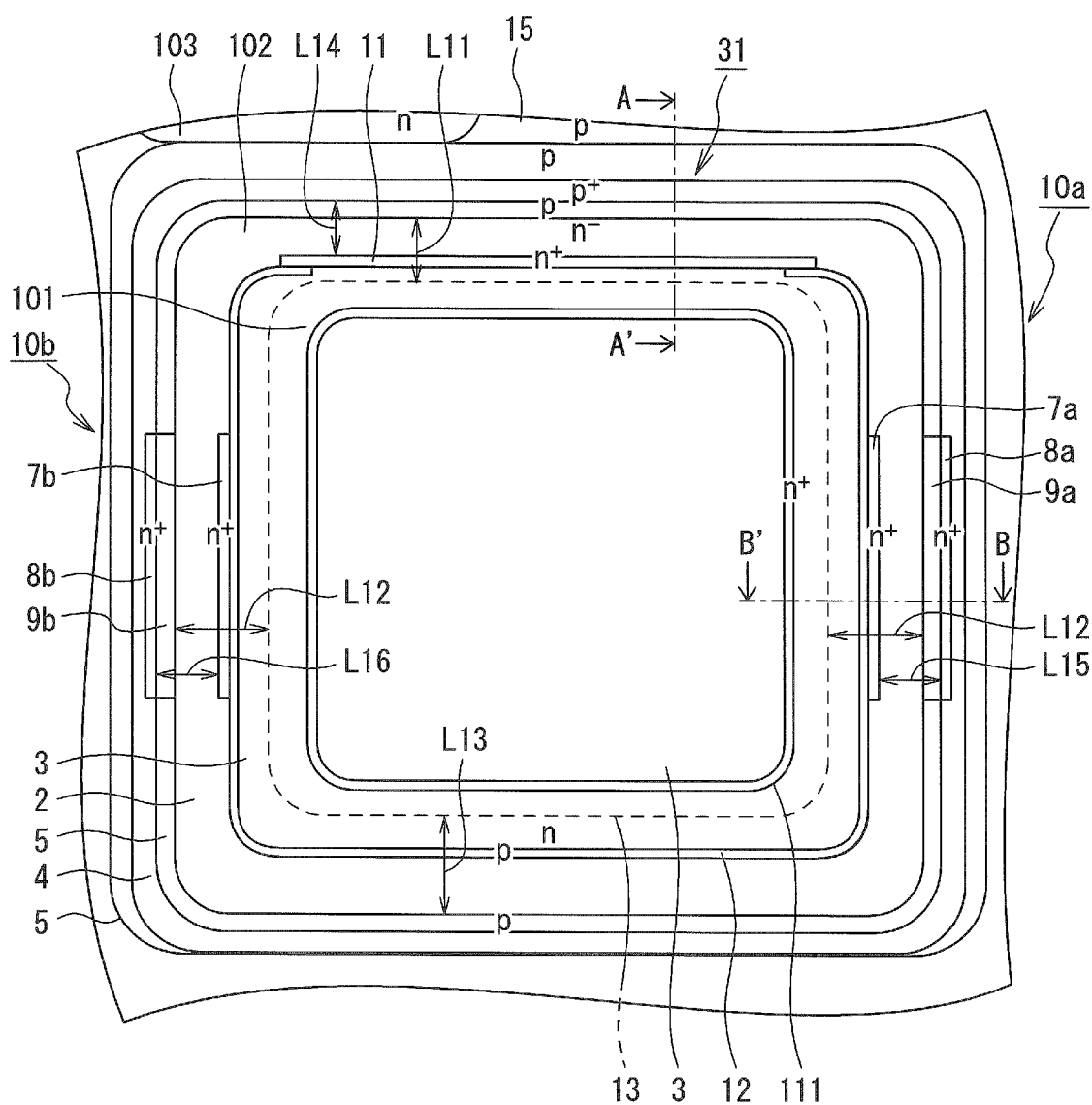
FIG. 11 is a plan view illustrating an example of a semiconductor integrated circuit of a first modified example.
Figure 12:
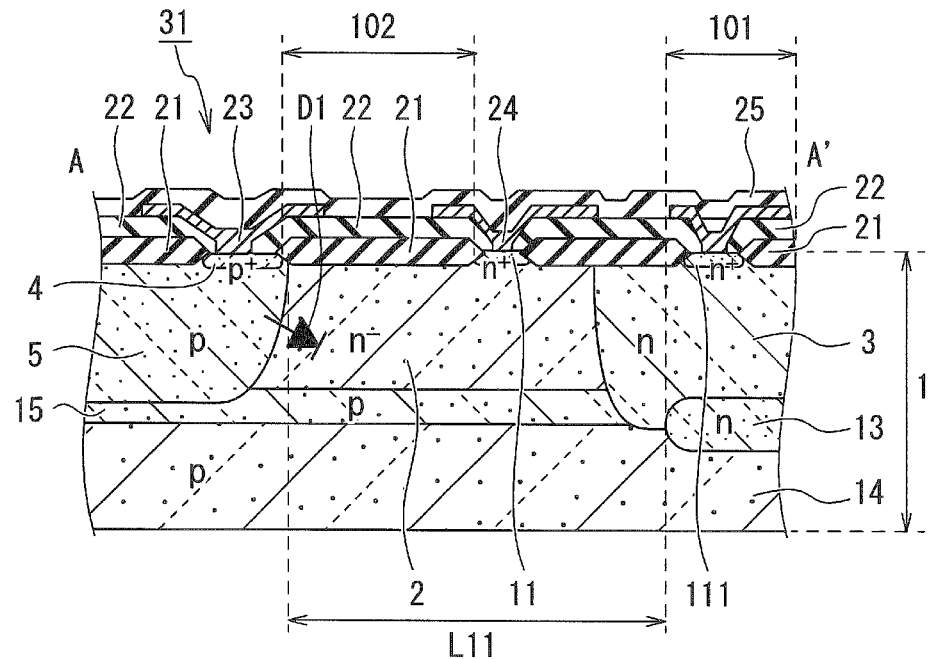
FIG. 12 is a cross-sectional view as viewed from direction A-A' in FIG. 11.
Figure 13:
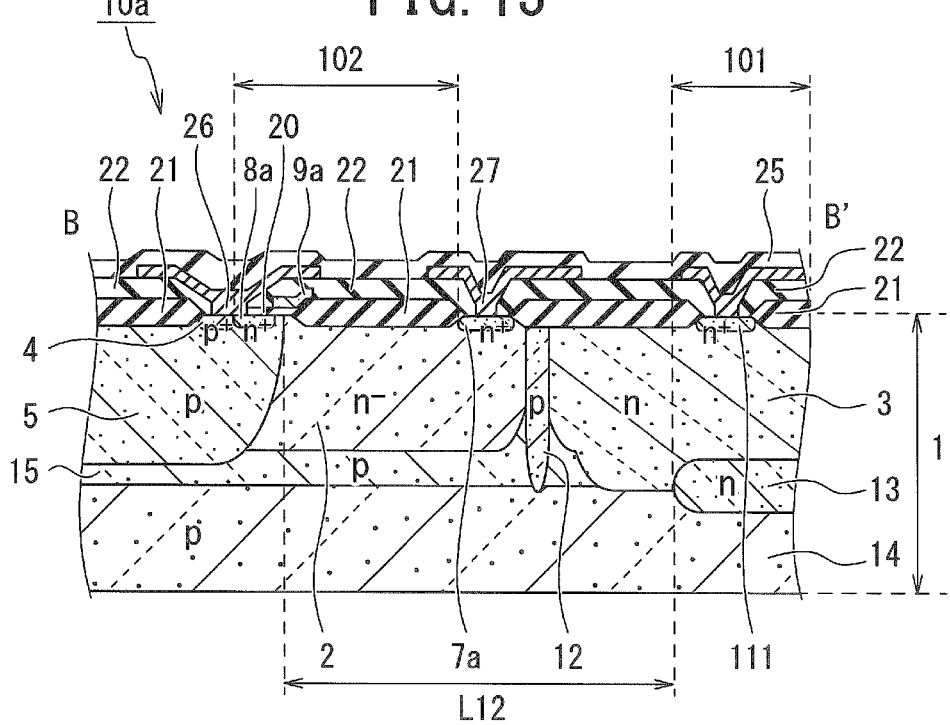
FIG. 13 is a cross-sectional view as viewed from direction B-B' in FIG. 11.

FIG. 11 is a view illustrating a planar layout of a semiconductor integrated circuit according to a first modified example of the embodiment corresponding to the planar layout of the semiconductor integrated circuit according to the embodiment illustrated in FIG. 2. FIG. 12 is a cross-sectional view as viewed from direction A-A' in FIG. 11, including the diode-forming region 31 illustrated in FIG. 11. FIG. 13 is a cross-sectional view as viewed from direction B-B' in FIG. 11, including the first level conversion element 10a illustrated in FIG. 11. The semiconductor integrated circuit according to the first modified example illustrated in FIG. 11 and FIG. 12 differs from the semiconductor integrated circuit according to the embodiment illustrated in FIG. 2 and FIG. 3 in that the first contact region 11 is provided at the upper portion of the drift region 2. The first contact region 11 is only required to be located within the drift region 2.

As illustrated in FIG. 11 and FIG. 13, the semiconductor integrated circuit according to the first modified example of the embodiment differs from the semiconductor integrated circuit according to the embodiment illustrated in FIG. 2 and FIG. 4 in that the $n^+$-type first drain region (the first carrier reception region) 7a in the first level conversion element 10a and the $n^+$-type second drain region (the second carrier reception region) 7b in the second level conversion element 10b are arranged in the upper portion of the drift region 2. The first carrier reception region 7a and the second carrier reception region 7b are only required to be located within the drift region 2. The slit region 12 is provided to penetrate the drift region 2 in the depth direction. The bottom portion of the slit region 12 is in contact with the epitaxially-grown layer 15. The slit region 12 may be implemented by the epitaxially-grown layer 15 such that a part of the drift region 2 is missed. The other elements in the semiconductor integrated circuit according to the first modified example are equivalent to those in the semiconductor integrated circuit according to the embodiment, and overlapping explanation are not repeated below.

According to the semiconductor integrated circuit of the first modified example, the first distance L11 between the looped well region 5 and the buried layer 13 in the diode-forming region 31 is set to be shorter than the second distance L12 between the looped well region 5 and the buried layer 13 in the respective portions in which the first level conversion element 10a and the second level conversion element 10b are formed, as in the case of the semiconductor integrated circuit according to the embodiment, so as to relax the electric field in the first level conversion element 10a and the second level conversion element 10b to improve the ESD tolerance in the entire semiconductor integrated circuit accordingly.

Second Modified Example

Figure 14:
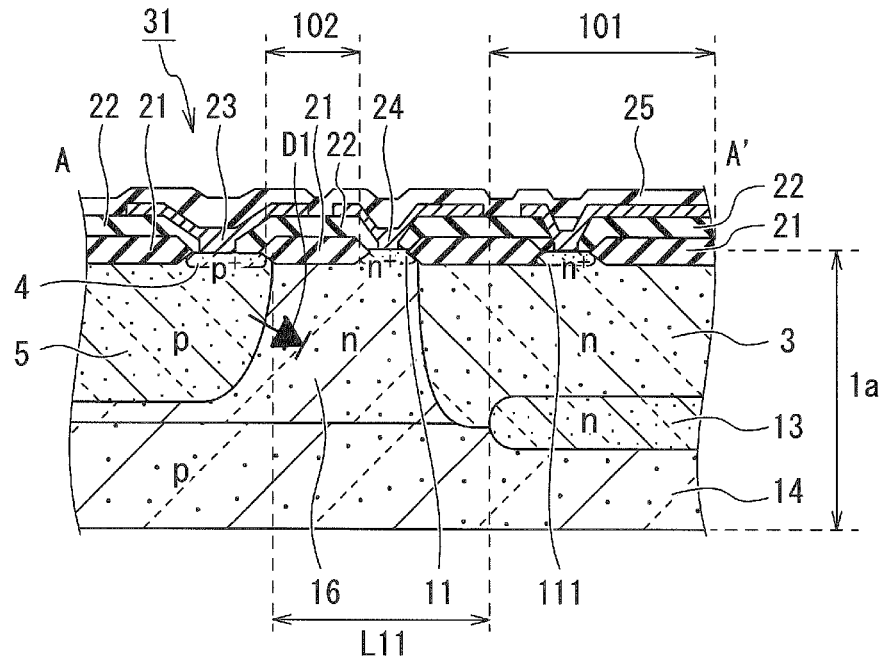
FIG. 14 is a cross-sectional view illustrating a semiconductor integrated circuit according to a second modified example, corresponding to the cross-sectional view as viewed from direction A-A' in FIG. 11.
Figure 15:
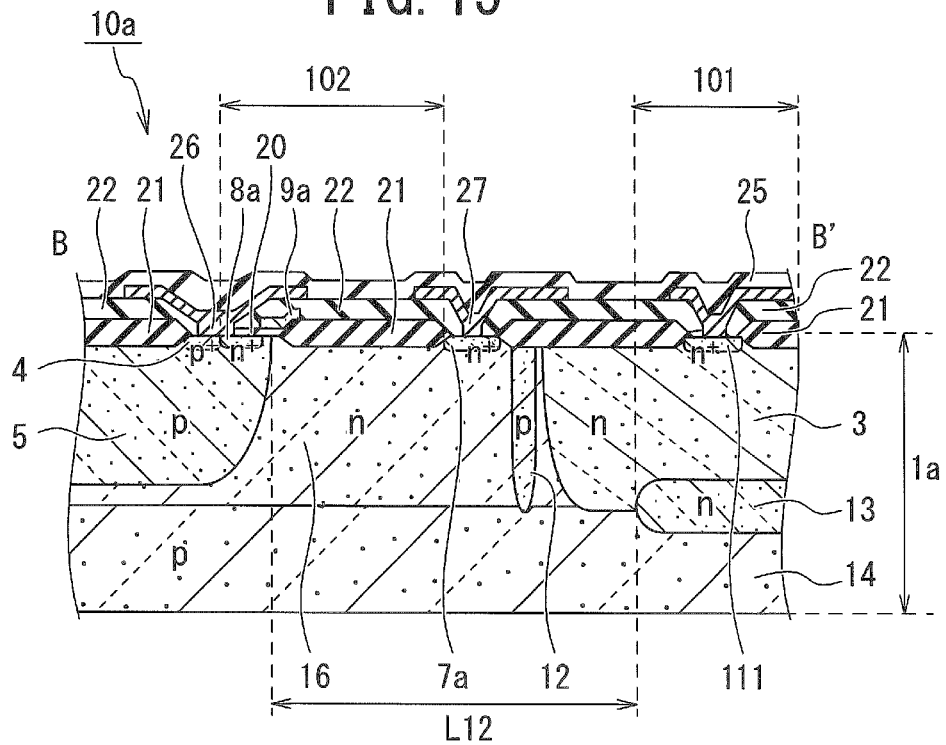
FIG. 15 is a cross-sectional view illustrating the semiconductor integrated circuit according to the second modified example, corresponding to the cross-sectional view as viewed from direction B-B' in FIG. 11.

FIG. 14 and FIG. 15 are cross-sectional views each illustrating a semiconductor integrated circuit according to a second modified example of the embodiment. The cross-sectional view of FIG. 14 corresponds to the cross-sectional view including the diode-forming region 31 in the semiconductor integrated circuit according to the first modified example illustrated in FIG. 12. The cross-sectional view of FIG. 15 corresponds to the cross-sectional view including the first level conversion element 10a in the semiconductor integrated circuit according to the first modified example illustrated in FIG. 13.

The semiconductor integrated circuit according to the second modified example illustrated in FIG. 14 and FIG. 15 differs from the semiconductor integrated circuit according to the first modified example illustrated in FIG. 12 and FIG. 13 in that the base body 1a includes the p-type semiconductor substrate 14 made of S1, and an epitaxially-grown layer 16 of n-type made of S1 deposited on the semiconductor substrate 14. As illustrated in FIG. 14, the $n^+$-type first contact region 11 is provided at the upper portion of the epitaxially-grown layer 16. As illustrated in FIG. 15, the epitaxially-grown layer 16 serves as the drift region of the first level conversion element 10a. The epitaxially-grown layer 16 has a looped shape in a planar pattern similar to the looped shape of the drift region 2 illustrated in FIG. 11. The slit region 12 is provided to penetrate the epitaxially-grown layer 16 in the depth direction. The bottom portion of the slit region 12 is in contact with the semiconductor substrate 14. The slit region 12 may be provided to penetrate the middle well region 3 in the depth direction. In such a case, the first contact region 11, and the first drain region 7a and the second drain region 7b may be provided at the upper portion of the middle well region 3, as illustrated in FIG. 3 and FIG. 4. The other elements in the semiconductor integrated circuit according to the second modified example are equivalent to those in the semiconductor integrated circuit according to the embodiment, and overlapping explanation are not repeated below.

According to the semiconductor integrated circuit of the second modified example, the first distance L11 between the looped well region 5 and the buried layer 13 in the diode-forming region 31 is set to be shorter than the second distance L12 between the looped well region 5 and the buried layer 13 in the respective portions in which the first level conversion element 10a and the second level conversion element 10b are formed, as in the case of the semiconductor integrated circuit according to the embodiment, so as to relax the electric field in the first level conversion element 10a and the second level conversion element 10b to improve the ESD tolerance in the entire semiconductor integrated circuit accordingly.

Third Modified Example

Figure 16:
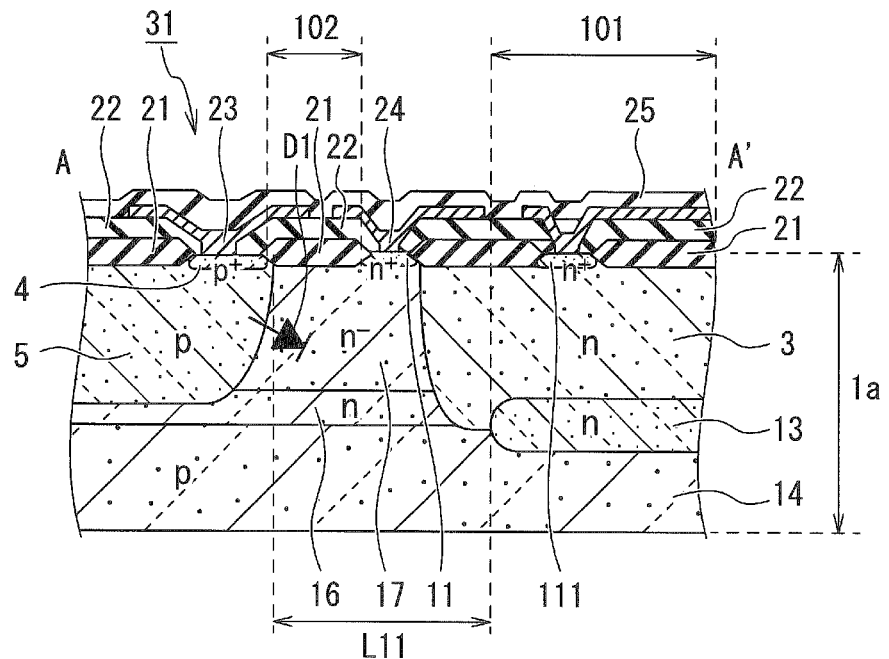
FIG. 16 is across-sectional view illustrating a semiconductor integrated circuit according to a third modified example, corresponding to the cross-sectional view as viewed from direction A-A' in FIG. 11.
Figure 17:
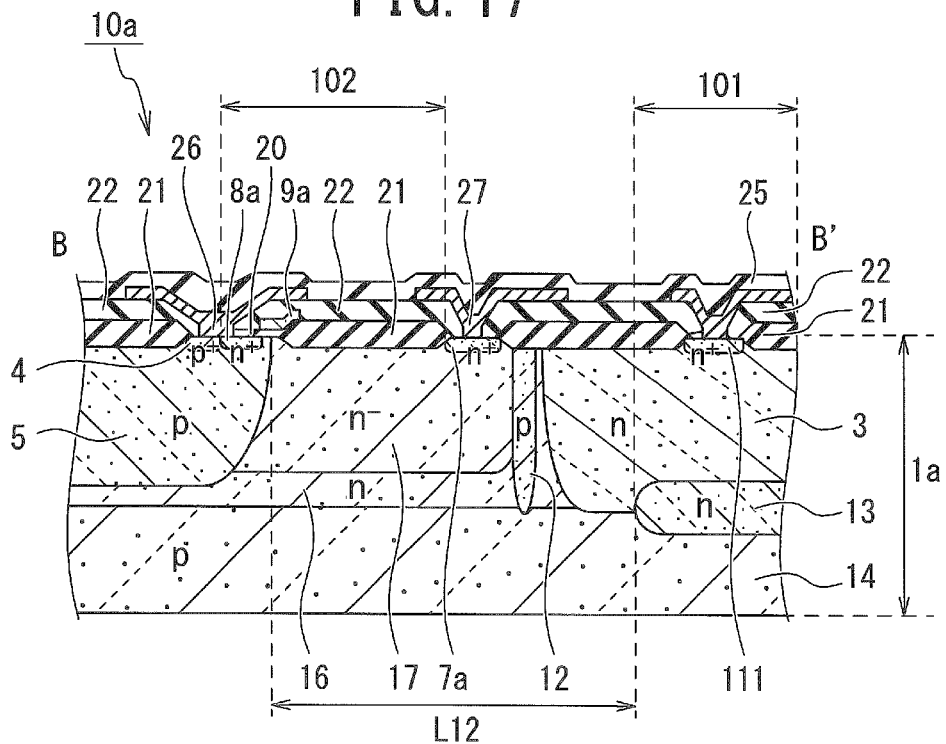
FIG. 17 is cross-sectional view illustrating the semiconductor integrated circuit according to the third modified example, corresponding to the cross-sectional view as viewed from direction B-B' in FIG. 11.

FIG. 16 and FIG. 17 are cross-sectional views each illustrating a semiconductor integrated circuit according to a third modified example of the embodiment. The cross-sectional view of FIG. 16 corresponds to the cross-sectional view including the diode-forming region 31 in the semiconductor integrated circuit according to the second modified example illustrated in FIG. 14. The cross-sectional view of FIG. 17 corresponds to the cross-sectional view including the first level conversion element 10a in the semiconductor integrated circuit according to the second modified example illustrated in FIG. 15.

The semiconductor integrated circuit according to the third modified example illustrated in FIG. 16 and FIG. 17 has a configuration equivalent to that in the semiconductor integrated circuit according to the second modified example illustrated in FIG. 14 and FIG. 15, using the base body 1a including the p-type semiconductor substrate 14 made of S1, and the n-type epitaxially-grown layer 16 made of S1 deposited on the semiconductor substrate 14. The semiconductor integrated circuit according to the third modified example differs from the semiconductor integrated circuit according to the second modified example in further including an impurity-doped region (a diffusion region) 17 of n⁻-type in the upper portion of the epitaxially-grown layer 16 having a higher impurity concentration than the epitaxially-grown layer 16. As illustrated in FIG. 16, the n⁺-type first contact region 11 is provided at the upper portion of the diffusion region 17. As illustrated in FIG. 17, the diffusion region 17 serves as the drift region of the first level conversion element 10a. The diffusion region 17 has a looped shape in a planar pattern similar to the looped shape of the drift region 2 illustrated in FIG. 11.

The diffusion region 17 may be in contact with the middle well region 3. The slit region 12 is then provided to penetrate the diffusion region 17 and the epitaxially-grown layer 16 in the depth direction. The slit region 12 may be provided to penetrate the middle well region 3 in the depth direction. In such a case, the first contact region 11, and the first drain region 7a and the second drain region 7b may be provided at the upper portion of the middle well region 3, as illustrated in FIG. 3 and FIG. 4. The other elements in the semiconductor integrated circuit according to the third modified example are equivalent to those in the semiconductor integrated circuit according to the second modified example, and overlapping explanation are not repeated below.

According to the semiconductor integrated circuit according to the third modified example, the first distance L11 between the looped well region 5 and the buried layer 13 in the diode-forming region 31 is set to be shorter than the second distance L12 between the looped well region 5 and the buried layer 13 in the respective portions in which the first level conversion element 10a and the second level conversion element 10b are formed, as in the case of the semiconductor integrated circuit according to the embodiment, so as to relax the electric field in the first level conversion element 10a and the second level conversion element 10b to improve the ESD tolerance in the entire semiconductor integrated circuit accordingly.

Fourth Modified Example

Figure 18:
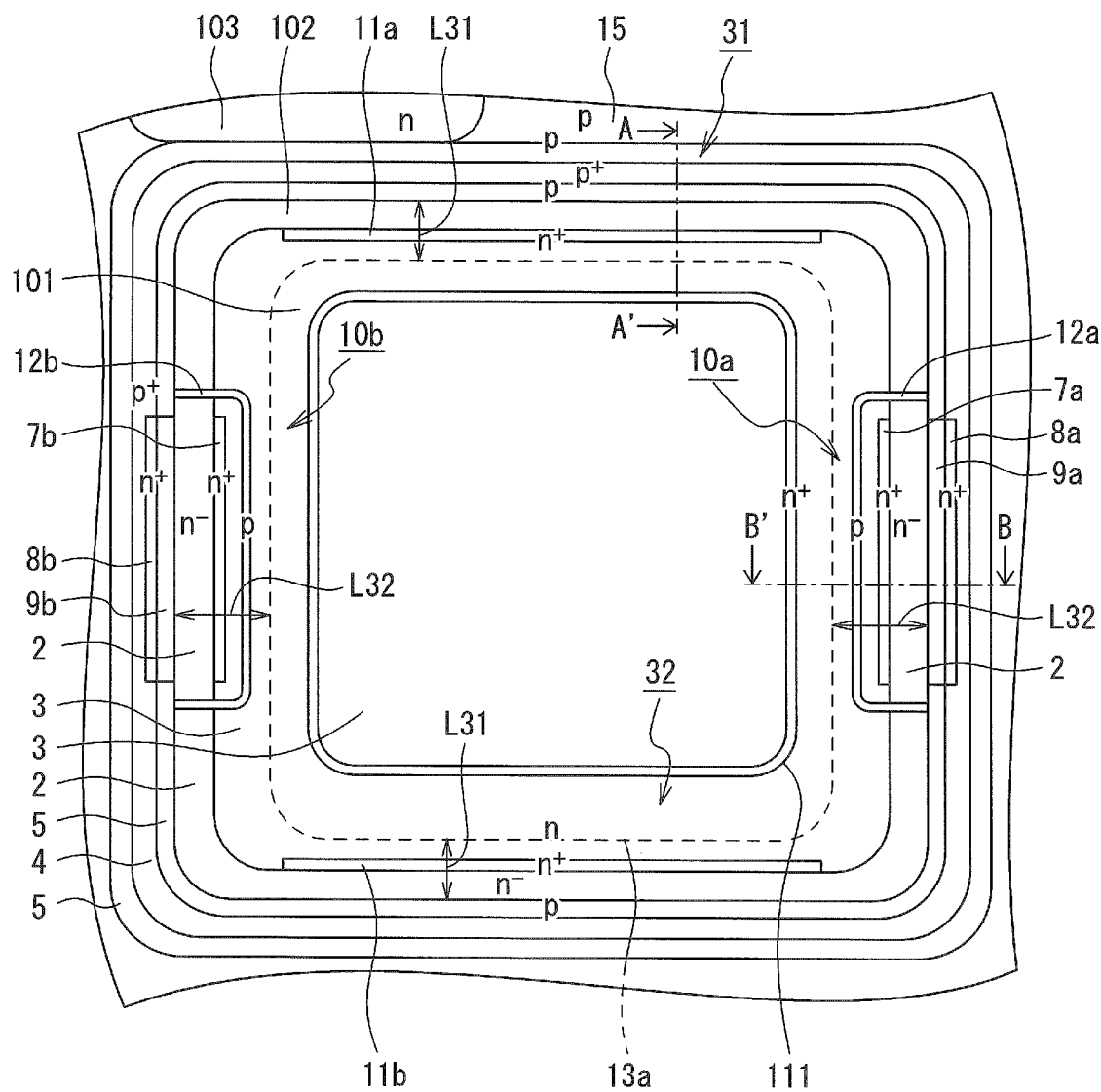
FIG. 18 is a plan view illustrating an example of a semiconductor integrated circuit of a fourth modified example.

FIG. 18 is a view illustrating a planar layout of a semiconductor integrated circuit according to a fourth modified example of the embodiment corresponding to the planar layout of the semiconductor integrated circuit according to the embodiment illustrated in FIG. 2. As illustrated in FIG. 18, the semiconductor integrated circuit according to the fourth modified example of the embodiment differs from the semiconductor integrated circuit according to the embodiment illustrated in FIG. 2 which uses the parasitic resistance value regulation method, in using a method (a division RESURF method) in which slit regions 12a and 12b of p-type surround the respective circumferences of the first carrier reception region 7a in the first level conversion element 10a and the second carrier reception region 7b in the second level conversion element 10b so as to electrically isolate the first level conversion element 10a and the second level conversion element 10b from the high-side circuit region 101.

As illustrated in FIG. 18, the high-side circuit region 101 is provided in the n-type middle well region 3. The middle well region 3 has a substantially rectangular shape in a planar pattern including straight portions and arc-like portions. First contact regions 11a and 11b of n⁺-type are each partly provided at the circumference of the middle well region 3. The first contact region 11a extends straight along one side (the upper side) of the middle well region 3. The second contact region 11b extends straight along the opposite side (the lower side) of the middle well region 3 opposite to the upper side.

The p-type slit regions 12a and 12b are provided at the other parts of the circumference of the middle well region 3. The slit regions 12a and 12b having a C-like shape with the respective openings facing in the opposite directions on the opposite sides (on the left side and the right side) of the middle well region 3. The slit regions 12a and 12b are provided to surround the first level conversion element 10a and the second level conversion element 10b. The respective end portions of the slit regions 12a and 12b are in contact with the looped well region 5. The configurations of the first level conversion element 10a and the second level conversion element 10b are equivalent to those in the semiconductor integrated circuit according to the embodiment illustrated in FIG. 2, and overlapping explanation are not repeated below.

The HVJT 102 includes the n⁻-type drift region (the voltage blocking region) 2 provided into a looped shape to surround the middle well region 3. The p-type looped well region 5 is provided into a looped shape along the circumference of the drift region 2. The p⁺-type second contact region 4 is provided into a looped shape along the circumference of the looped well region 5. The diode-forming region 31 is provided on the upper side in FIG. 18 in which the first contact region 11a and a part of the second contact region 4 face each other. A diode-forming region 32 is provided on the lower side in FIG. 18 in which the first contact region 11b and a part of the second contact region 4 face each other.

The cross-sectional view of FIG. 18 as viewed from direction A-A' including the diode-forming region 31 is similar to the cross-sectional view of the semiconductor integrated circuit according to the embodiment illustrated in FIG. 3. The cross-sectional view of FIG. 18 as viewed from direction B-B' including the first level conversion element 10a is similar to the cross-sectional view of the semiconductor integrated circuit according to the embodiment illustrated in FIG. 4.

FIG. 18 indicates the position of the n-type buried layer 13a buried under the middle well region 3 by the broken line. The buried layer 13a has a substantially rectangular shape in a planar pattern. In the semiconductor integrated circuit according to the fourth modified example, the first distance L31 between the looped well region 5 and the buried layer 13a in the respective diode-forming regions 31 and 32 is set to be shorter than the second distance L32 between the looped well region 5 and the buried layer 13a in the respective portions in which the first level conversion element 10a and the second level conversion element 10b are formed. The other elements in the semiconductor integrated circuit according to the fourth modified example are equivalent to those in the semiconductor integrated circuit according to the embodiment, and overlapping explanation are not repeated below.

According to the semiconductor integrated circuit according to the fourth modified example, the first distance L31 between the looped well region 5 and the buried layer 13a in the respective diode-forming regions 31 and 32 is set to be shorter than the second distance L32 between the looped well region 5 and the buried layer 13a in the respective portions in which the first level conversion element 10a and the second level conversion element 10b are formed, as in the case of the semiconductor integrated circuit according to the embodiment, so as to relax the electric field in the first level conversion element 10a and the second level conversion element 10b to improve the ESD tolerance in the entire semiconductor integrated circuit accordingly.

Fifth Modified Example

Figure 19:
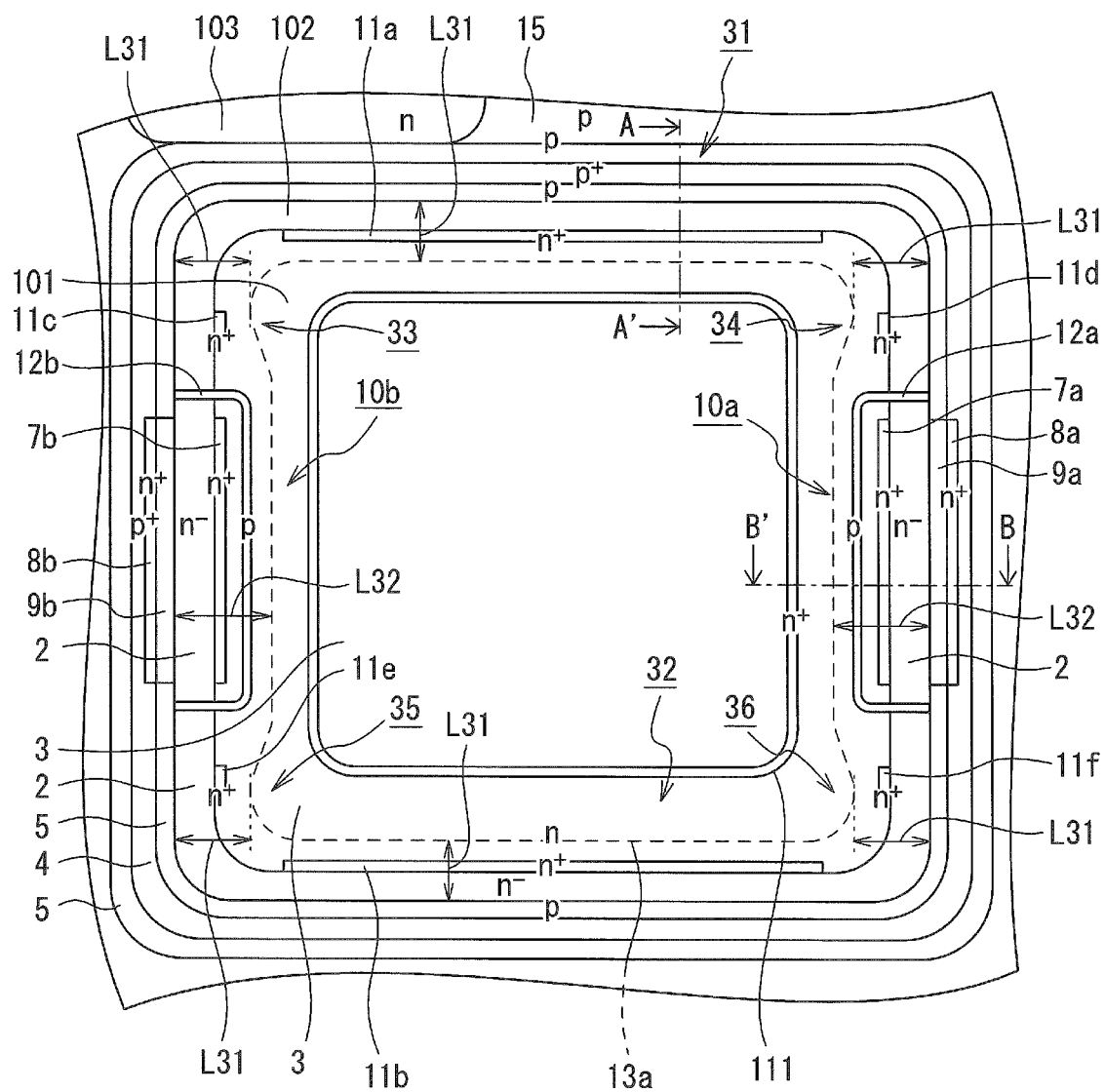
FIG. 19 is a plan view illustrating an example of a semiconductor integrated circuit of a fifth modified example.

FIG. 19 is a view illustrating a planar layout of a semiconductor integrated circuit according to a fifth modified example of the embodiment corresponding to the planar layout of the semiconductor integrated circuit according to the fourth modified example illustrated in FIG. 18. As illustrated in FIG. 19, the semiconductor integrated circuit according to the fifth modified example has a configuration equivalent to that in the semiconductor integrated circuit according to the fourth modified example illustrated in FIG. 18, using the method (the division RESURF method) in which the p-type slit regions 12a and 12b surround the respective circumferences of the first carrier reception region 7a in the first level conversion element 10a and the second carrier reception region 7b in the second level conversion element 10b so as to electrically isolate the first level conversion element 10a and the second level conversion element 10b from the high-side circuit region 101.

As illustrated in FIG. 19, the semiconductor integrated circuit according to the fifth modified example differs from the semiconductor integrated circuit according to the fourth modified example illustrated in FIG. 18 in further including first contact regions 11c, 11d, 11e, and 11f of n⁺-type at the four corners of the n-type middle well region 3. The first contact regions 11d and 11f are arranged on the same right side of the middle well region 3 as the first level conversion element 10a. The first contact regions 11c and 11e are arranged on the same left side of the middle well region 3 as the second level conversion element 10b. The respective first contact regions 11c to 11f face to part of the p⁺-type second contact region 4 with the looped shape, so as to serve as the respective diode-forming regions 33, 34, 35, and 36.

The first contact regions 11c to 11f are illustrated with the substantially rectangular shape or straight shape in the planar pattern, but are not limited to either shape. The first contact regions 11c and 11d may be connected to the first contact region 11a so as to serve as an integrated first contact region. The first contact regions 11e and 11f may be connected to the first contact region 11b so as to serve as an integrated first contact region.

The semiconductor integrated circuit according to the fifth modified example differs from the semiconductor integrated circuit according to the fourth modified example illustrated in FIG. 18 in that the buried layer 13a with the rectangular shape in the planar pattern is recessed inward in the middle portions on the left and right sides, as schematically indicated by the broken line in FIG. 19. The buried layer 13a is recessed inward to be gradually separated from the looped well region 5 adjacent to the portions in which the first level conversion element 10a and the second level conversion element 10b are formed, and is most distant from the looped well region 5 in the portions in which the first level conversion element 10a and the second level conversion element 10b are formed.

In the semiconductor integrated circuit according to the fifth modified example, the first distance L31 between the looped well region 5 and the buried layer 13a in the respective diode-forming regions 31 to 36 is set to be shorter than the second distance L32 between the looped well region 5 and the buried layer 13 in the respective portions in which the first level conversion element 10a and the second level conversion element 10b are formed. In other words, the buried layer 13a with the rectangular shape in the planar pattern is partly recessed (retracted) inward so as to provide the respective diode-forming regions 33 to 36 having the first distance L31 adjacent to the portions in which the first level conversion element 10a and the second level conversion element 10b having the second distance L32 are formed. The other elements in the semiconductor integrated circuit according to the fifth modified example are equivalent to those in the semiconductor integrated circuit according to the fourth modified example, and overlapping explanation are not repeated below.

According to the semiconductor integrated circuit of the fifth modified example, the first distance L31 between the looped well region 5 and the buried layer 13a in the diode-forming region 31 is set to be shorter than the second distance L32 between the looped well region 5 and the buried layer 13a in the respective portions in which the first level conversion element 10a and the second level conversion element 10b are formed, as in the case of the semiconductor integrated circuit according to the embodiment, so as to relax the electric field in the first level conversion element 10a and the second level conversion element 10b to improve the ESD tolerance in the entire semiconductor integrated circuit accordingly.

Providing the buried layer 13a to be gradually separated from the looped well region 5 as the buried layer 13a is closer to the portions in which the first level conversion element 10a and the second level conversion element 10b are formed, can avoid local concentration of the electric field. This structure further facilitates the formation of the diode-forming regions 33 to 36 having the first distance L31 between the looped well region 5 and the buried layer 13a adjacent to the portions in which the first level conversion element 10a and the second level conversion element 10b are formed.

Sixth Modified Example

Figure 20:
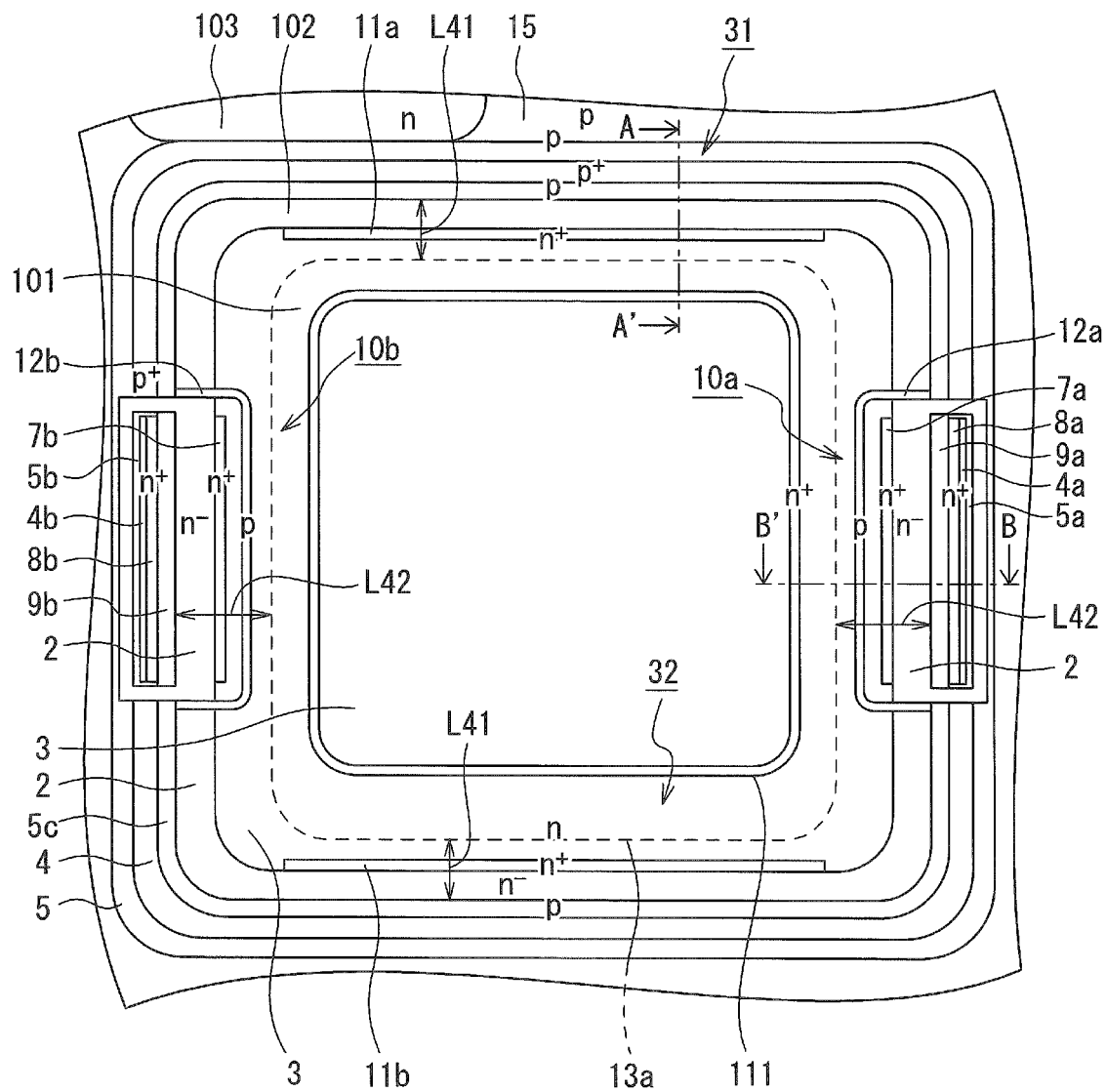
FIG. 20 is a plan view illustrating an example of a semiconductor integrated circuit of a sixth modified example.
Figure 21:
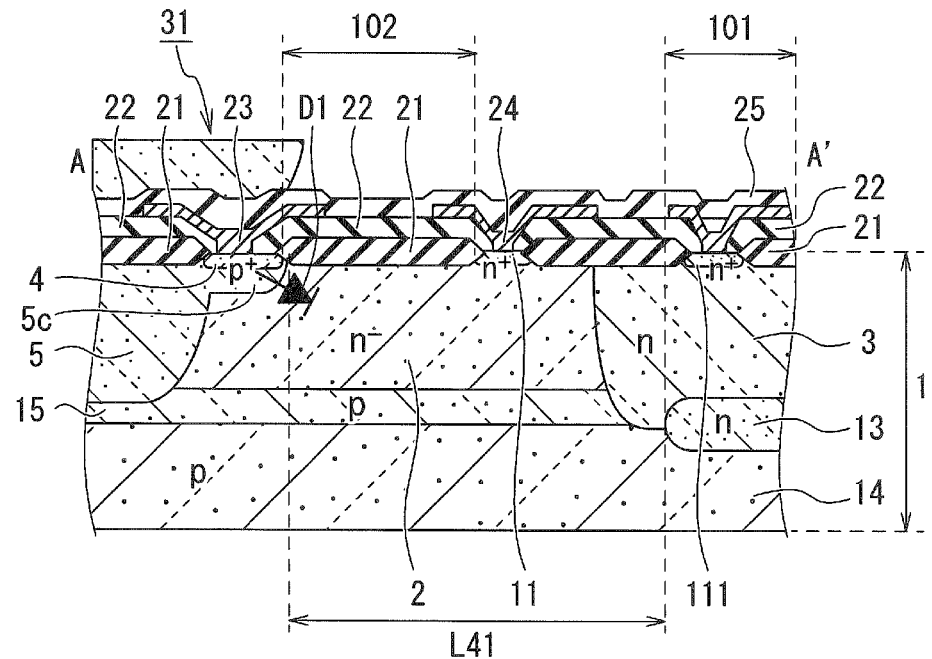
FIG. 21 is a cross-sectional view as viewed from direction A-A' in FIG. 20.
Figure 22:
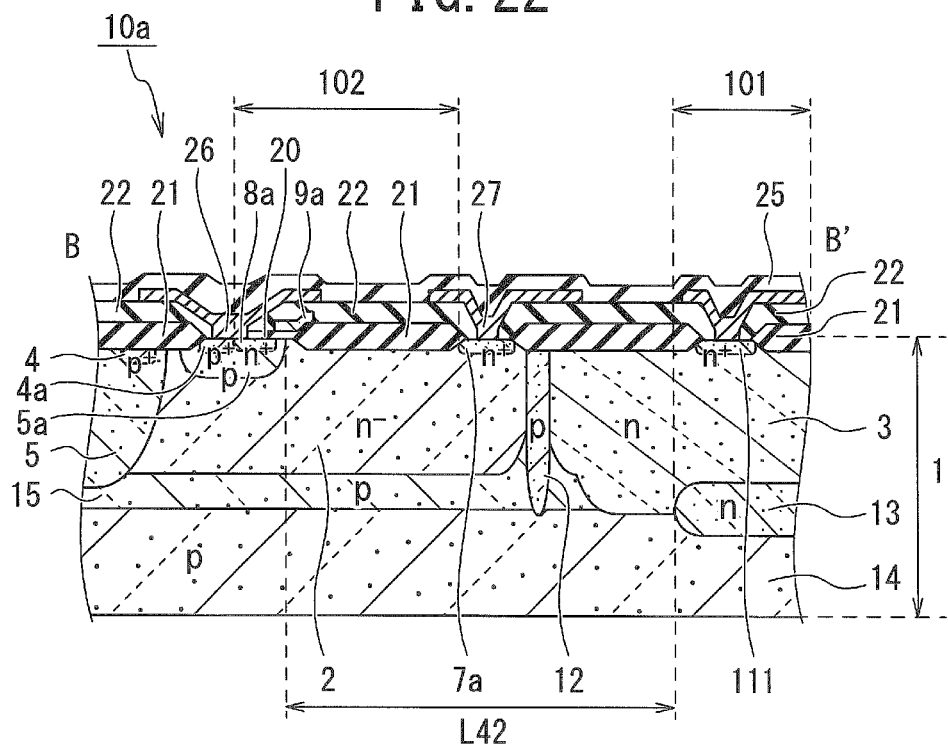
FIG. 22 is a cross-sectional view as viewed from direction B-B' in FIG. 20.

FIG. 20 is a view illustrating a planar layout of a semiconductor integrated circuit according to a sixth modified example of the embodiment corresponding to the planar layout of the semiconductor integrated circuit according to the fourth modified example illustrated in FIG. 18. FIG. 21 is a cross-sectional view as viewed from direction A-A' in FIG. 20, including the region (the diode-forming region) 31 illustrated on the upper side in FIG. 20 in which the second contact region 4 and the first contact region 11 face each other. FIG. 22 is a cross-sectional view as viewed from direction B-B' in FIG. 20, including the first level conversion element 10a illustrated in FIG. 20. As illustrated in FIG. 20, the semiconductor integrated circuit according to the sixth modified example has a configuration equivalent to that in the semiconductor integrated circuit according to the fourth modified example illustrated in FIG. 18, using the method (the division RESURF method) in which the p-type slit regions 12a and 12b electrically isolate the first level conversion element 10a and the second level conversion element 10b from the high-side circuit region 101.

As illustrated in FIG. 21, the semiconductor integrated circuit according to the sixth modified example differs from the semiconductor integrated circuit according to the fourth modified example illustrated in FIG. 18 in that the looped well region 5 includes a shallow region 5c on the inner side. The p$^+$-type second contact region 4 is provided at the upper portion of the shallow region 5c.

As illustrated in FIG. 20 and FIG. 22, the semiconductor integrated circuit according to the sixth modified example differs from the semiconductor integrated circuit according to the fourth modified example illustrated in FIG. 18 in further including a base region 5a of p-type provided on the inner side of the looped well region 5 and separated from the looped well region 5 in the portion in which the first level conversion element 10a is formed. The base region 5a has an impurity concentration which may be either the same as or higher than the impurity concentration of the looped well region 5. The n$^+$-type first carrier supply region 8a and a contact region 4a of n$^+$-type in contact with each other are provided at the upper portion of the base region 5a. The contact region 4a may have the same impurity concentration as the second contact region 4. The anode electrode 23 and the carrier supply electrode 26 are separated from each other, while the carrier supply electrode 26 is electrically connected to the ground potential terminal GND via a resistor element.

The second level conversion element 10b illustrated in FIG. 20 also has a mirror-image relationship to the first level conversion element 10a so as to have a configuration equivalent to the first level conversion element 10a. The second level conversion element 10b includes a base region 5b of p-type provided on the inner side of the looped well region 5 and separated from the looped well region 5. The n$^+$-type second carrier supply region 8b and a contact region 4b of n$^+$-type in contact with each other are provided at the upper portion of the base region 5b.

In this case, the first distance L41 in the diode-forming region 31 is a distance between the shallow region 5c and the buried layer 13a, and the second distance L42 in the respective portions in which the first level conversion element 10a and the second level conversion element 10b are formed is a distance between the respective base regions 5a and 5b and the buried layer 13a. The first distance L41 is shorter than the second distance L42. The other elements in the semiconductor integrated circuit according to the sixth modified example are equivalent to those in the semiconductor integrated circuit according to the fourth modified example, and overlapping explanation are not repeated below.

According to the semiconductor integrated circuit of the sixth modified example, the first distance L41 in the diode-forming region 31 is set to be shorter than the second distance L42 in the respective portions in which the first level conversion element 10a and the second level conversion element 10b are formed, as in the case of the semiconductor integrated circuit according to the embodiment, so as to relax the electric field in the first level conversion element 10a and the second level conversion element 10b to improve the ESD tolerance in the entire semiconductor integrated circuit accordingly.

While the semiconductor integrated circuit according to the sixth modified example is illustrated with the case in which the looped well region 5 is separated from the respective base regions 5a and 5b, the respective base regions 5a and 5b may be connected to the looped well region 5 so as to serve as the looped well region 5 including the shallow base regions. The anode electrode 23 and the carrier supply electrode 26 are then a common electrode to be electrically connected to the ground potential terminal GND.

The semiconductor integrated circuit according to the sixth modified example has been illustrated with the division RESURF method, but may also use the parasitic resistance value regulation method.

Seventh Modified Example

Figure 23:
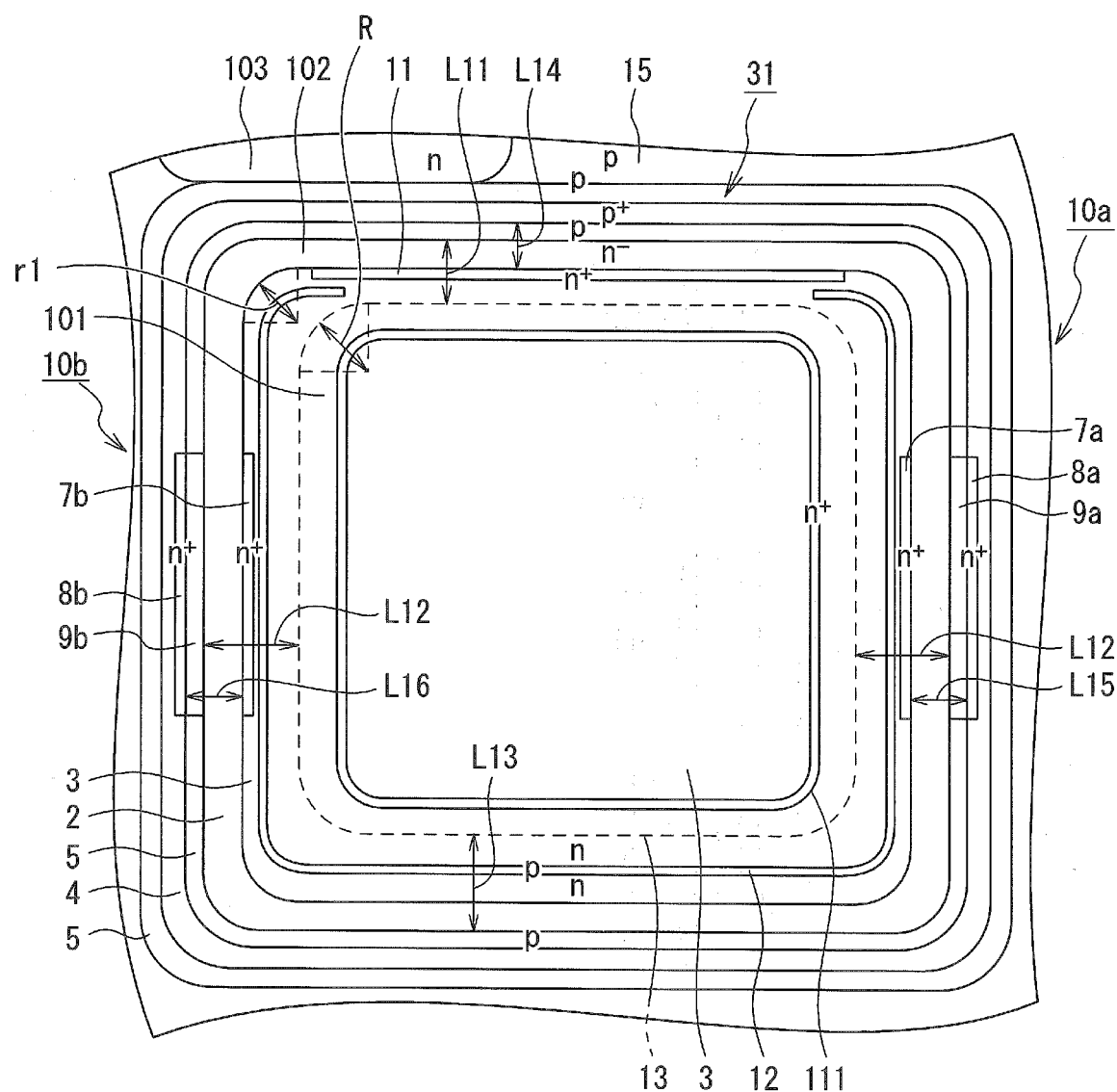
FIG. 23 is a plan view illustrating an example of a semiconductor integrated circuit of a seventh modified example.

FIG. 23 is a view illustrating a planar layout of a semiconductor integrated circuit according to a seventh modified example of the embodiment corresponding to the planar layout of the semiconductor integrated circuit according to the embodiment illustrated in FIG. 2. The high-side circuit region 101 is provided in the middle well region 3 of n-type. The middle well region 3 has a substantially rectangular shape in a planar pattern. The HVJT 102 is provided with the drift region (voltage blocking region) 2 of n$^-$-type having a looped shape (a frame-like shape) to surround the circumference of the middle well region 3. The looped well region 5 of p-type is provided into a looped shape around the circumference of the drift region 2.

FIG. 23 schematically indicates the position of the n-type buried layer 13 in the planar pattern under the middle well region 3 by the broken line. This broken line corresponds to the outer circumferential of the high-side circuit region 101 in the planar pattern. The buried layer 13 has a substantially rectangular shape in the planar pattern. The first distance L11 between the looped well region 5 and the buried layer 13 in the diode-forming region 31 is shorter than the second distance L12 between the looped well region 5 and the buried layer 13 in respective portions in which the first level conversion element 10a and the second level conversion element 10b are formed.

A radius of curvature R at four corner portions of the substantially rectangular shape of the buried layer 13 is preferably greater than a radius of curvature r1 at four corner portions of the substantially rectangular shape of the middle well region 3. For example, when the breakdown voltage of the diode-forming region 31 is 825 volts, the radius of curvature R at the four corner portions of the substantially rectangular shape of the buried layer 13 is preferably greater than or equal to about 80 micrometers, and the radius of curvature r1 at the four corner portions of the substantially rectangular shape of the middle well region 3 is preferably about 50 to 60 micrometers. If the radius of curvature R of the buried layer 13 is shorter than the radius of curvature r1 of the middle well region 3, an electric field concentrates at the corner portions of the buried layer 13. Therefore, the avalanche current flows at the corner portions of the buried layer 13 before the avalanche current flows at the diode-forming region 31. In contrast, the radius of curvature R of the buried layer 13 is set to be greater than the radius of curvature r1 of the middle well region 3, so as to relax the electric field at the corner portions of the buried layer 13. Therefore, the breakdown voltage at the corner portions of the buried layer 13 can be higher than the breakdown voltage at the diode-forming region 31.

The cross-sectional view of FIG. 23 as viewed from direction A-A' including the diode-forming region 31 is similar to the cross-sectional view of the semiconductor integrated circuit according to the embodiment illustrated in FIG. 3. The cross-sectional view of FIG. 23 as viewed from direction B-B' including the first level conversion element 10a is similar to the cross-sectional view of the semiconductor integrated circuit according to the embodiment illustrated in FIG. 4. The other elements in the semiconductor integrated circuit according to the seventh modified example are equivalent to those in the semiconductor integrated circuit according to the embodiment, and overlapping explanation are not repeated below.

Figure 24:
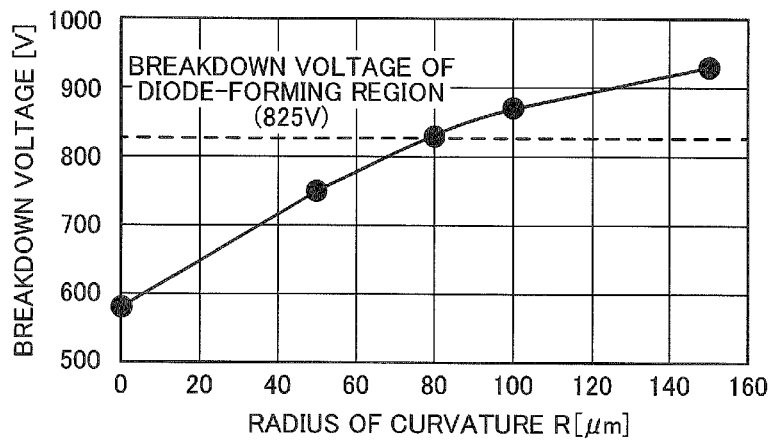
FIG. 24 is a graph illustrating a relationship between a radius of curvature of a buried layer of the semiconductor integrated circuit of the seventh modified example and a breakdown voltage.

FIG. 24 indicates a relationship between the radius of curvature R of the buried layer 13 and the breakdown voltage. FIG. 24 indicates in the case of a rated voltage of the semiconductor integrated circuit is 600 volts. The breakdown voltage of the semiconductor integrated circuit is set by a surge voltage being applied to the terminal VS in the circuit diagram illustrated in FIG. 1. Here, the breakdown voltage of the semiconductor integrated circuit is set to 820 volts. The greater the radius of curvature R of the buried layer 13, the more the electric field at the corner portions of the buried layer 13 is relaxed and therefore the higher the breakdown voltage. For this reason, the radius of curvature R is preferably set to be greater as the required breakdown voltage is higher. When the breakdown voltage of the diode-forming region 31 is 825 volts, as indicated by the broken line in FIG. 24, the breakdown voltage of the buried layer 13 is higher than the breakdown voltage of the diode-forming region 31 by setting the radius of curvature R of the buried layer 13 to be greater than or equal to 80 micrometers.

Figure 25:
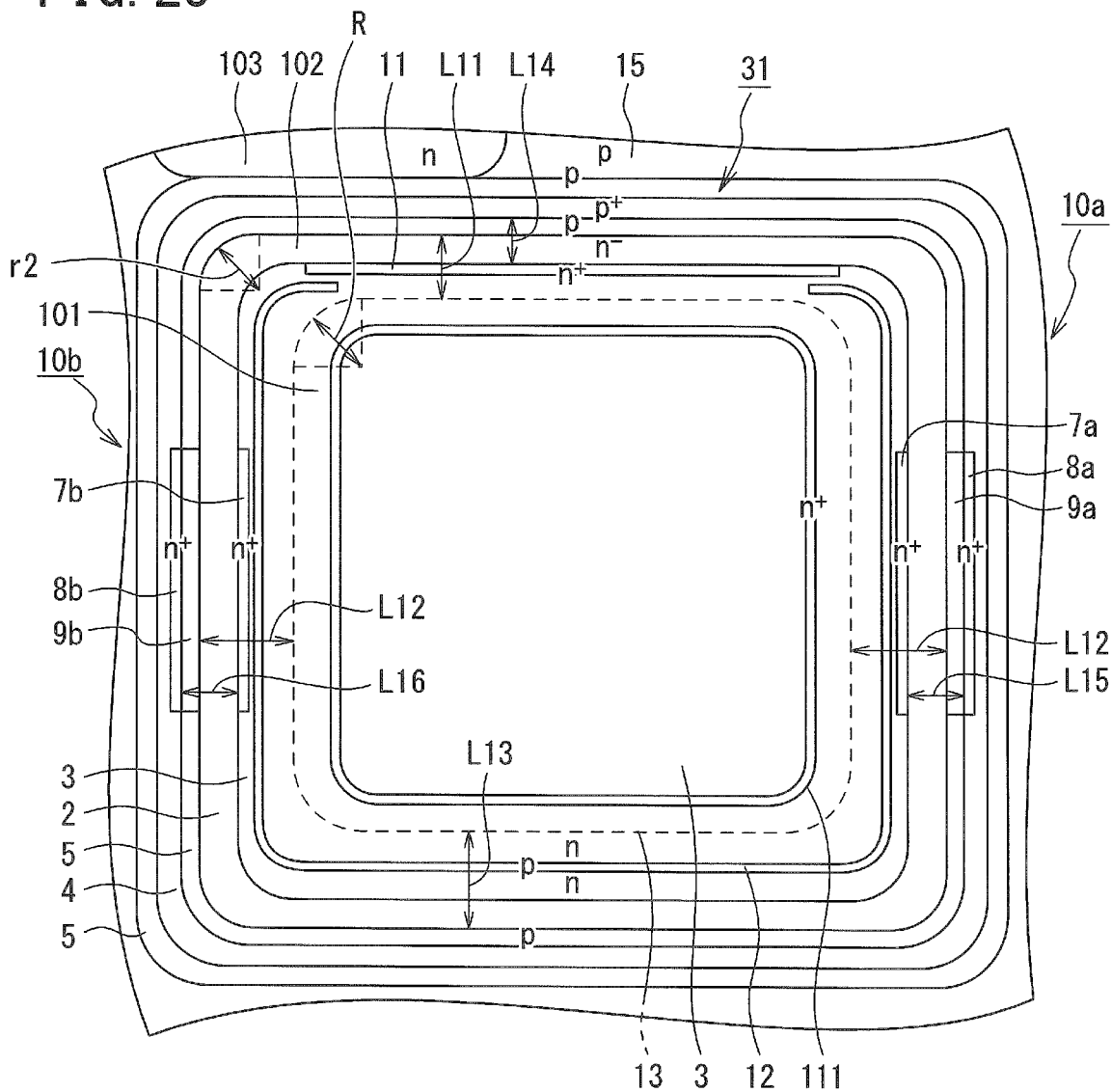
FIG. 25 is another plan view illustrating the example of the semiconductor integrated circuit of the seventh modified example.

FIG. 25 is a view illustrating a planar layout similar to the planar layout of a semiconductor integrated circuit according to the seventh modified example illustrated in FIG. 23. FIG. 25 schematically indicates the radius of curvature R at the corner portion of the substantially rectangular shape of the buried layer 13 and the radius of curvature r2 at the outer corner portion of the drift region 2. The radius of curvature R of the buried layer 13 may be greater than the radius of curvature r2 of the drift region 2 in the planar pattern. The radius of curvature r2 of the drift region 2 is greater than the radius of curvature r1 of the middle well region 3 illustrated in FIG. 23. For example, the radius of curvature r2 of the drift region 2 is about 100 micrometers.

According to the semiconductor integrated circuit of the seventh modified example, the first distance L11 between the looped well region 5 and the buried layer 13 in the diode-forming region 31 is set to be shorter than the second distance L12 between the looped well region 5 and the buried layer 13 in the respective portions in which the first level conversion element 10a and the second level conversion element 10b are formed, as in the case of the semiconductor integrated circuit according to the embodiment, so as to relax the electric field in the first level conversion element 10a and the second level conversion element 10b to improve the ESD tolerance in the entire semiconductor integrated circuit accordingly.

Furthermore, even if the breakdown voltage of the diode-forming region 31 is high, the radius of curvature R of the buried layer 13 is set to be greater than the radius of curvature r1 of the middle well region 3 and is set to be greater than or equal to 80 micrometers, so as to relax the electric field at the corners of the buried layer 13. Therefore, the breakdown voltage at the corner portions of the buried layer 13 can be higher than the breakdown voltage at the diode-forming region 31. The semiconductor integrated circuit according to the seventh modified example has been illustrated with the parasitic resistance value regulation method, but may also use the division RESURF method.

Eighth Modified Example

Figure 26:
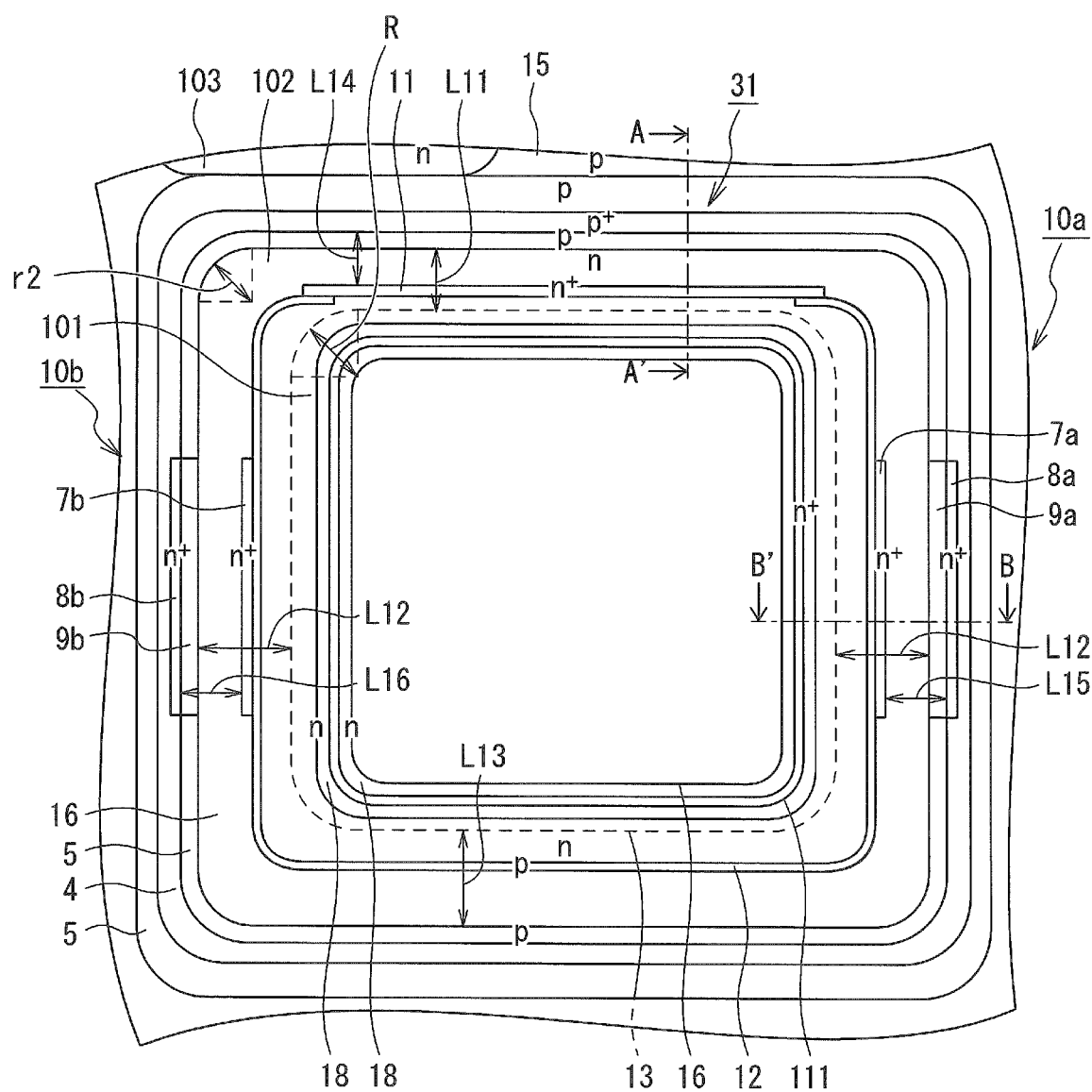
FIG. 26 is a plan view illustrating an example of a semiconductor integrated circuit of an eighth modified example.
Figure 27:
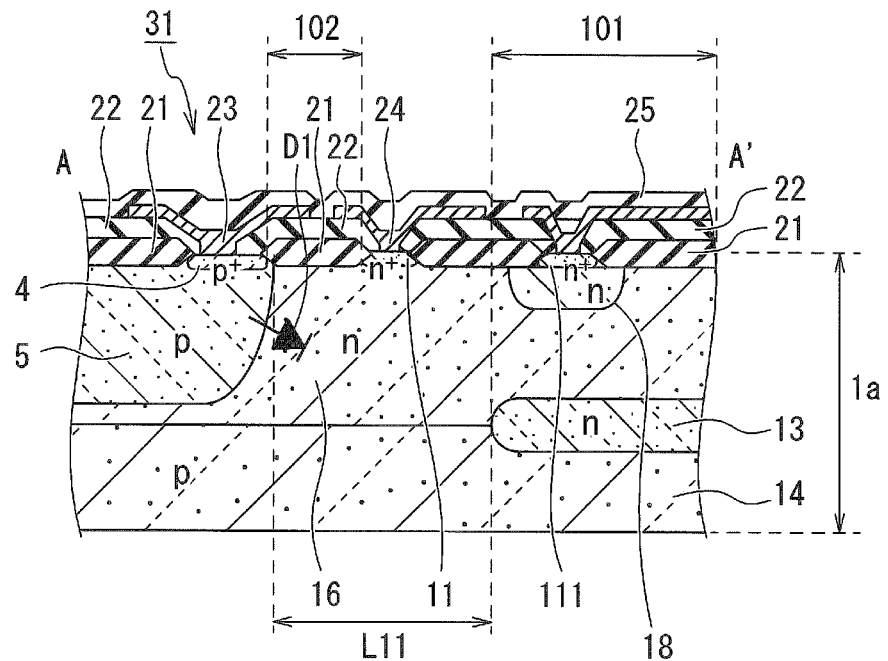
FIG. 27 is a cross-sectional view as viewed from direction A-A' in FIG. 26.
Figure 28:
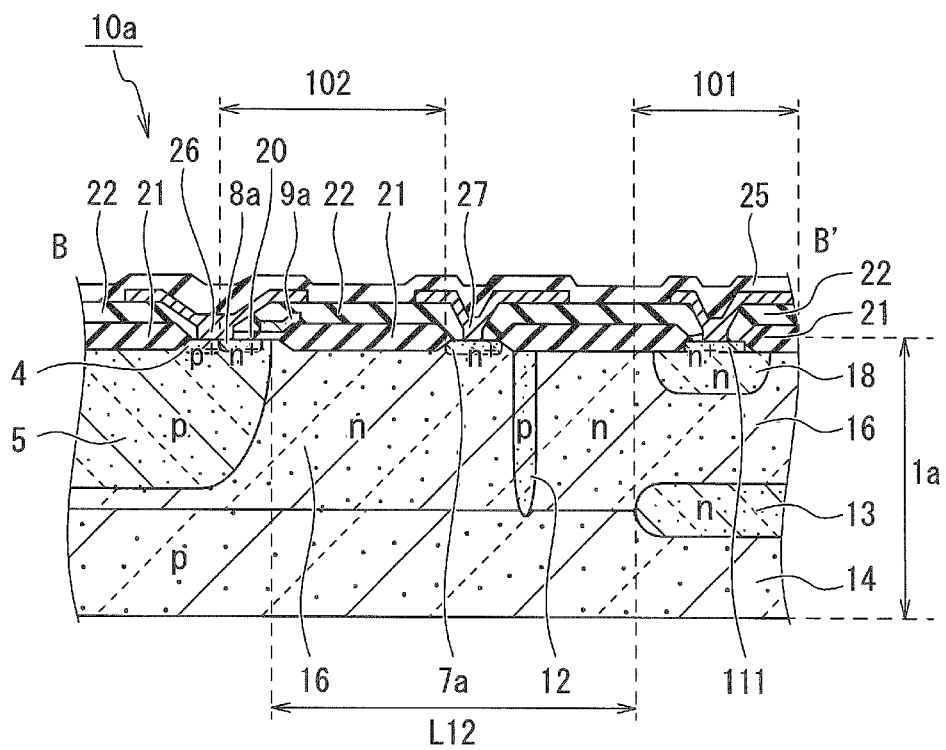
FIG. 28 is a cross-sectional view as viewed from direction B-B' in FIG. 26.

FIG. 26 is a view illustrating a planar layout of a semiconductor integrated circuit according to an eighth modified example of the embodiment corresponding to the planar layout of the semiconductor integrated circuit according to the first modified example illustrated in FIG. 11. FIG. 27 is a cross-sectional view as viewed from direction A-A' in FIG. 26, including the diode-forming region 31 illustrated in FIG. 26. FIG. 28 is a cross-sectional view as viewed from direction B-B' in FIG. 26, including the first level conversion element 10a illustrated in FIG. 26.

As illustrated in FIG. 26 to FIG. 28, the semiconductor integrated circuit according to the eighth modified example differs from the semiconductor integrated circuit according to the first modified example illustrated in FIG. 11 in lacking the n-type middle well region 3 provided in the high-side circuit region 101. Furthermore, the semiconductor integrated circuit according to the eighth modified example differs from the semiconductor integrated circuit according to the first modified example illustrated in FIG. 11 in that the drift region 16 is implemented by an epitaxially-grown layer of n-type. The planar layout of a surface exposure portion of p-n junction portion formed by the drift region 16 and the looped well region 5 (the outer circumferential of the HVJT 102) has a substantially rectangular shape in the planar pattern. This substantially rectangular shape is defined as a planar pattern of the drift region 16. The drift region 16 is not limited to be implemented by the n-type epitaxially-grown layer. For example, the drift region 16 may be implemented by a diffusion region of n⁻-type formed in an epitaxially-grown layer of p-type, as in the case of the semiconductor integrated circuit according to the embodiment.

Furthermore, the semiconductor integrated circuit according to the eighth modified example differs from the semiconductor integrated circuit according to the first modified example illustrated in FIG. 11 in that a buffer layer 18 of n-type is provided in an upper portion of the drift region 16. The contact region 111 of n⁺-type is delineated into a looped shape (a frame-like shape) in an upper portion of the buffer layer 18. The buffer layer 18 may be provided as needed, or may not be provided.

As illustrated in FIG. 26, the radius of curvature R of the buried layer 13 is preferably greater than the radius of curvature r2 at the corners of the substantially rectangular shape of the drift region 16 in a planar pattern. For example, the radius of curvature r2 of the drift region 16 is about 100 micrometers. The other elements in the semiconductor integrated circuit according to the eighth modified example are equivalent to those in the semiconductor integrated circuit according to the first modified example, and overlapping explanation are not repeated below.

According to the semiconductor integrated circuit of the eighth modified example, the first distance L11 between the looped well region 5 and the buried layer 13 in the diode-forming region 31 is set to be shorter than the second distance L12 between the looped well region 5 and the buried layer 13 in the respective portions in which the first level conversion element 10a and the second level conversion element 10b are formed, as in the case of the semiconductor integrated circuit according to the embodiment, so as to relax the electric field in the first level conversion element 10a and the second level conversion element 10b to improve the ESD tolerance in the entire semiconductor integrated circuit accordingly.

Furthermore, even if the breakdown voltage of the diode-forming region 31 is high, the radius of curvature R of the buried layer 13 is set to be greater than the radius of curvature r2 at the corners of the substantially rectangular shape of the drift region 16, so as to relax the electric field at the corners of the buried layer 13. Therefore, the breakdown voltage at the corner portions of the buried layer 13 can be higher than the breakdown voltage at the diode-forming region 31. The semiconductor integrated circuit according to the eighth modified example has been illustrated with the parasitic resistance value regulation method, but may also use the division RESURF method.

Other Embodiments

While the present invention has been described above by reference to the embodiment, it should be understood that the present invention is not intended to be limited to the descriptions and the drawings composing part of this disclosure. Various alternative embodiments, examples, and technical applications will be apparent to those skilled in the art according to this disclosure.

While the above embodiment has been illustrated with the case of including the two active elements of the first level conversion element 10a and the second level conversion element 10b, the semiconductor integrated circuit is only required to include at least one active element, and the number of the active elements serving as a level shifter may be three or five or greater.

While the above embodiment has been illustrated with the case of the semiconductor integrated circuit using the S1 substrate in the base body 1, the technical idea described in the embodiment may be applied to a semiconductor integrated circuit using a semiconductor of a compound such as arsenic gallium (GaAs). The technical idea described in the embodiment may also be applied to a semiconductor integrated circuit using a wide-bandgap semiconductor such as SiC, gallium nitride (GaN), or diamond, or may be applied to a semiconductor integrated circuit using a narrow-bandgap semiconductor such as indium antimonide (InSb) or semimetal.

The method of manufacturing the first level conversion element 10a and the second level conversion element 10b, and the slit region 12 in the internal circuit of the high-side circuit region 101 may be either the parasitic resistance value regulation method or the division RESURF method. For example, a structure may be employed in which the first level conversion element 10a and the second level conversion element 10b are separated from the internal circuit of the high-side circuit region 101 by a trench filled with an insulating film, for example, instead of the use of the p-type slit regions 12a and 12b as illustrated in FIG. 18.

Various alternative embodiments, examples, and technical applications will be apparent to those skilled in the art according to the technical idea disclosed in the above embodiment. It should be understood that the present invention includes various embodiments not disclosed herein, such as a configuration to which the respective configurations as described in the above embodiment and the respective modified examples are optionally applied. Therefore, the technical scope of the present invention is defined only by the subject matter according to the claims reasonably derived from the foregoing descriptions.

What is claimed is:

1. A semiconductor integrated circuit including a high-potential-side circuit region, a high-voltage junction termination structure surrounding the high-potential-side circuit region, and a low-potential-side circuit region surrounding the high-potential-side circuit region via the high-voltage junction termination structure which are integrated into a single chip, the semiconductor integrated circuit comprising:

a middle well region of a first conductivity-type provided in the high-potential-side circuit region;

a buried layer of the first conductivity-type buried uniformly at a lower portion of the middle well region and having planar pattern and a higher impurity concentration than the middle well region;

a drift region of the first conductivity-type having a looped shape provided in the high-voltage junction termination structure surrounding a circumference of the middle well region;

a looped well region of a second conductivity-type surrounding a circumference of the drift region;

a carrier supply region of the first conductivity type provided in the looped well region, and included in a level conversion element included in a level shift circuit for communicating signals between the low-potential-side circuit region and the high-potential-side circuit region;

a carrier reception region of the first conductivity-type included in the level conversion element, provided in either the drift region or the middle well region, and having a higher impurity concentration than the drift region or the middle well region; and
a first contact region of the first conductivity-type provided in either the drift region or the middle well region separately from the carrier reception region, and having a higher impurity concentration than the drift region or the middle well region,
wherein a smallest value of a first distance between the looped well region and the buried layer in a region in which the first contact region is formed is smaller than a smallest value of a second distance between the looped well region and the buried layer in a region in which the carrier reception region is formed.

2. A semiconductor integrated circuit including a high-potential-side circuit region, a high-voltage junction termination structure surrounding the high-potential-side circuit region, and a low-potential-side circuit region surrounding the high-potential-side circuit region via the high-voltage junction termination structure which are integrated into a single chip, the semiconductor integrated circuit comprising:
a middle well region of a first conductivity-type provided in the high-potential-side circuit region;
a buried layer of the first conductivity-type buried at a lower portion of the middle well region and having a higher impurity concentration than the middle well region;
a drift region of the first conductivity-type having a looped shape provided in the high-voltage junction termination structure surrounding a circumference of the middle well region;
a looped well region of a second conductivity-type surrounding a circumference of the drift region;
a base region of the second conductivity type provided in the drift region;
a carrier supply region of the first conductivity type provided in the base region, and included in a level conversion element included in a level shift circuit for communicating signals between the low-potential-side circuit region and the high-potential-side circuit region;
a carrier reception region of the first conductivity-type included in the level conversion element, provided in either the drift region or the middle well region, and having a higher impurity concentration than the drift region or the middle well region; and
a first contact region of the first conductivity-type provided in either the drift region or the middle well region separately from the carrier reception region, and having a higher impurity concentration than the drift region or the middle well region,
wherein a smallest value of a first distance between the looped well region and the buried layer in a region in which the first contact region is formed is smaller than a smallest value of a second distance between the looped well region and the buried layer in a region in which the carrier reception region is formed.

3. The semiconductor integrated circuit of claim 1, further comprising:
a control electrode provided in the looped well region, and included in the level conversion element on a surface at a portion interposed between the carrier supply region and the drift region via a gate insulating film;
a carrier supply electrode in contact with the carrier supply region and a second contact region;
a carrier reception electrode in contact with the carrier reception region; and
a diode electrode in contact with the first contact region.

4. The semiconductor integrated circuit of claim 2, wherein:
the carrier supply region is provided in the base region of the second conductivity type provided on an inner side of the looped well region; and
the semiconductor integrated circuit further comprises:
a control electrode provided in the base region, and included in the level conversion element on a surface at a portion interposed between the carrier supply region and the drift region via a gate insulating film;
a carrier supply electrode in contact with the carrier supply region;
a carrier reception electrode in contact with the carrier reception region; and
a diode electrode in contact with the first contact region.

5. The semiconductor integrated circuit of claim 1, wherein the middle well region is selectively provided in an epitaxially-grown layer of the second conductivity-type provided on a semiconductor substrate of the second conductivity-type.

6. The semiconductor integrated circuit of claim 1, wherein:
the drift region is an epitaxially-grown layer of the first conductivity-type provided on a semiconductor substrate of the second conductivity-type; and
the middle well region is selectively provided in the epitaxially-grown layer.

7. The semiconductor integrated circuit of claim 1, wherein:
the middle well region is selectively provided in an epitaxially-grown layer of the first conductivity-type provided on a semiconductor substrate of the second conductivity-type; and
the drift region is selectively provided in the epitaxially-grown layer.

8. The semiconductor integrated circuit of claim 5, wherein the buried layer is interposed between the semiconductor substrate and the middle well region.

9. The semiconductor integrated circuit of claim 5, further comprising a slit region of the second conductivity-type provided between the carrier reception region and the high-potential-side circuit region in a direction connecting the carrier supply region and the carrier reception region, and penetrating either the drift region or the middle well region in a depth direction to reach either the epitaxially-grown layer or the semiconductor substrate.

10. The semiconductor integrated circuit of claim 9, wherein the slit region is provided to surround the middle well region in a planar pattern.

11. The semiconductor integrated circuit of claim 9, wherein the slit region extends to the drift region to surround the carrier reception region in a planar pattern.

12. The semiconductor integrated circuit of claim 11, wherein the buried layer is gradually separated from the looped well region as the buried layer is closer to the level conversion element in the planar pattern.

13. The semiconductor integrated circuit of claim 12, wherein:
the middle well region has a rectangular shape in the planar pattern; and
the middle well region is provided with a region in which the level conversion element is formed and a region in which a p-n junction diode is formed on one side of the rectangular shape.

14. The semiconductor integrated circuit of claim 1, wherein:

each of the buried layer and the middle well region has a rectangular shape in the planar pattern; and a radius of curvature at a corner portion of the buried layer is greater than a radius of curvature at a corner portion of the middle well region in the planar pattern.

15. The semiconductor integrated circuit of claim 1, wherein:

the buried layer has a rectangular shape in the planar pattern;

the drift region has a frame-like shape in the planar pattern; and a radius of curvature at a corner portion of the buried layer is greater than a radius of curvature at a corner portion of the drift region in the planar pattern.

16. The semiconductor integrated circuit of claim 1, wherein:

the buried layer has a rectangular shape in the planar pattern; and a radius of curvature at a corner portion of the buried layer is greater than or equal to 80 micrometers in the planar pattern.

17. The semiconductor integrated circuit of claim 1, wherein a drift length of the region in which the first contact region is formed and a drift length of the level conversion element are the same.

18. The semiconductor integrated circuit of claim 2, wherein a drift length of the region in which the first contact region is formed and a drift length of the level conversion element are the same.

19. The semiconductor integrated circuit of claim 1, wherein the buried layer is uniformly buried between a semiconductor substrate of the second conductivity-type and the middle well region.

20. The semiconductor integrated circuit of claim 1, wherein the buried layer has a flat top surface in contact with the middle well region.

* * * * *